United States Patent
Linnen et al.

(10) Patent No.: US 11,482,292 B1
(45) Date of Patent: Oct. 25, 2022

(54) NON-VOLATILE STORAGE WITH PROCESSIVE WRITES

(71) Applicant: WESTERN DIGITAL TECHNOLOGIES, INC., San Jose, CA (US)

(72) Inventors: Daniel Linnen, Naperville, IL (US); Kirubakaran Periyannan, Santa Clara, CA (US); Khanfer Kukkady, San Jose, CA (US); Preston Thomson, Boise, ID (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/356,331

(22) Filed: Jun. 23, 2021

(51) Int. Cl.
   *G11C 16/34* (2006.01)
   *G11C 16/26* (2006.01)
   *G11C 16/16* (2006.01)
   *G11C 16/10* (2006.01)

(52) U.S. Cl.
   CPC ........ *G11C 16/3459* (2013.01); *G11C 16/102* (2013.01); *G11C 16/16* (2013.01); *G11C 16/26* (2013.01); *G11C 16/3404* (2013.01); *G11C 16/3445* (2013.01)

(58) Field of Classification Search
   CPC ... G11C 16/3459; G11C 16/102; G11C 16/26; G11C 16/16; G11C 16/3404
   See application file for complete search history.

(56) References Cited

U.S. PATENT DOCUMENTS

| | | |
|---|---|---|
| 4,691,299 A | 9/1987 | Rivest |
| 5,555,204 A | 9/1996 | Endoh |
| 5,936,884 A | 8/1999 | Hasbun |
| 7,196,928 B2 | 3/2007 | Chen |
| 8,131,191 B2 | 3/2012 | Hirayama |
| 8,258,075 B2 | 9/2012 | Nochi |
| 8,423,710 B1 | 4/2013 | Gole |
| 8,769,374 B2 | 7/2014 | Franceschini |
| 8,917,559 B2 | 12/2014 | Bisen |
| 9,070,451 B1 | 6/2015 | Yang |
| 9,099,185 B2 * | 8/2015 | Kim .................... G11C 13/004 |

(Continued)

OTHER PUBLICATIONS

Jagmohan, et al., "Write Amplification Reduction in NAND Flash through Multi-Write Coding," 2010 IEEE 26th Symposium on Mass Storage Systems and Technologies (MSST), 2010, pp. 1-6, doi: 10.1109/MSST.2010.5496985.

(Continued)

*Primary Examiner* — Han Yang
(74) *Attorney, Agent, or Firm* — Vierra Magen Marcus LLP

(57) ABSTRACT

A non-volatile storage system includes a control circuit connected to non-volatile memory cells provides for progressive writing of data. That is, existing data is overwritten by new data without performing a traditional erase operation that changes the threshold voltage of the memory cells back to the traditional or original erase state. In one example, new data is written on top of old data using shifted threshold voltage distributions. Some embodiments include writing MLC data over SLC data, using intermediate erase threshold voltage distributions and/or automatically detecting which threshold voltage distributions are currently being used to store data.

20 Claims, 20 Drawing Sheets

(56) References Cited

U.S. PATENT DOCUMENTS

| | | | |
|---|---|---|---|
| 9,153,287 B1 | 10/2015 | Hamilton | |
| 2016/0372185 A1* | 12/2016 | Shim | G11C 16/0483 |
| 2022/0189557 A1* | 6/2022 | Kim | G11C 16/10 |

OTHER PUBLICATIONS

Rivest, et al., "How to Reuse a 'Write Once' Memory," STOC '82: Proceedings of the fourteenth annual ACM Symposium on Theory of Computing, May 1982, pp. 105-113, https://doi.org/10.1145/800070.802182.

* cited by examiner

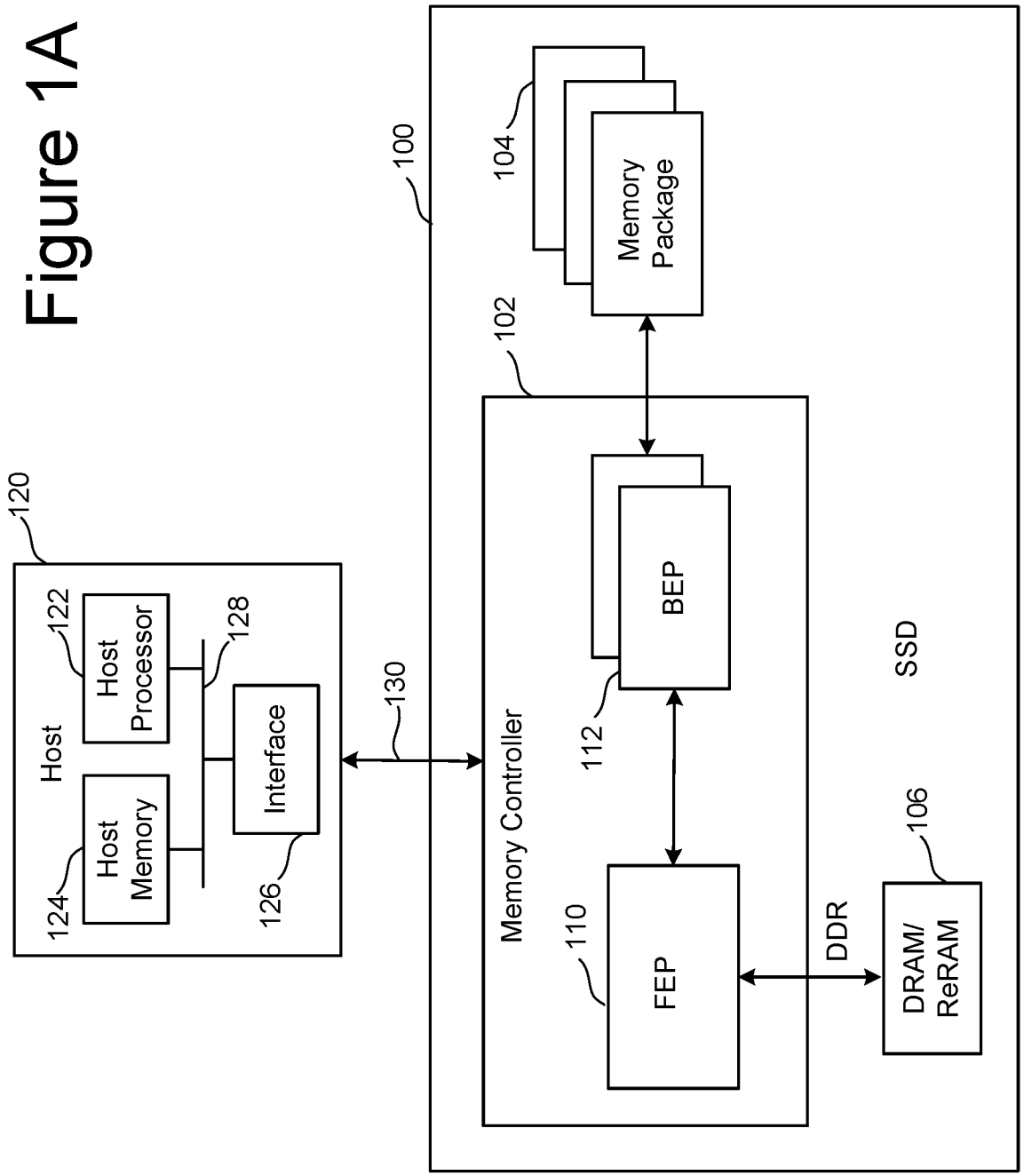

NON-VOLATILE STORAGE WITH PROGRESSIVE WRITES

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a power source (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory.

All or portions of the non-volatile memory can also be erased. For example, if data becomes stale or needs to be overwritten, the portion of the non-volatile memory storing the data can be erased so that the portion of the non-volatile memory can be available for storing new data. In some non-volatile memory, the traditional erase operation comprises lowering the threshold voltages of non-volatile memory cells from one or more programmed states to an erased state.

In some non-volatile memory, memory cells already storing valid data must be erased before they can be programmed again. However, the erasing process is typically performed at the block level while programming is performed at the page or sub-page level, with a block comprising many pages. Therefore, when overwriting data in a particular page of a particular block, all of the valid data in the pages of the particular block other than the particular page are moved and re-programmed to a new block, the new data is programmed to the new block, and the particular block is then erased and made available for future programming. The moving and re-programming of the valid data in the block slows down the programming process and uses extra space in the memory (as an area of the memory must be kept available for moving and re-programming data).

BRIEF DESCRIPTION OF THE DRAWINGS

Like-numbered elements refer to common components in the different figures.

FIG. 1A is a block diagram of one embodiment of a storage system connected to a host.

DETAILED DESCRIPTION

Figure 1B:
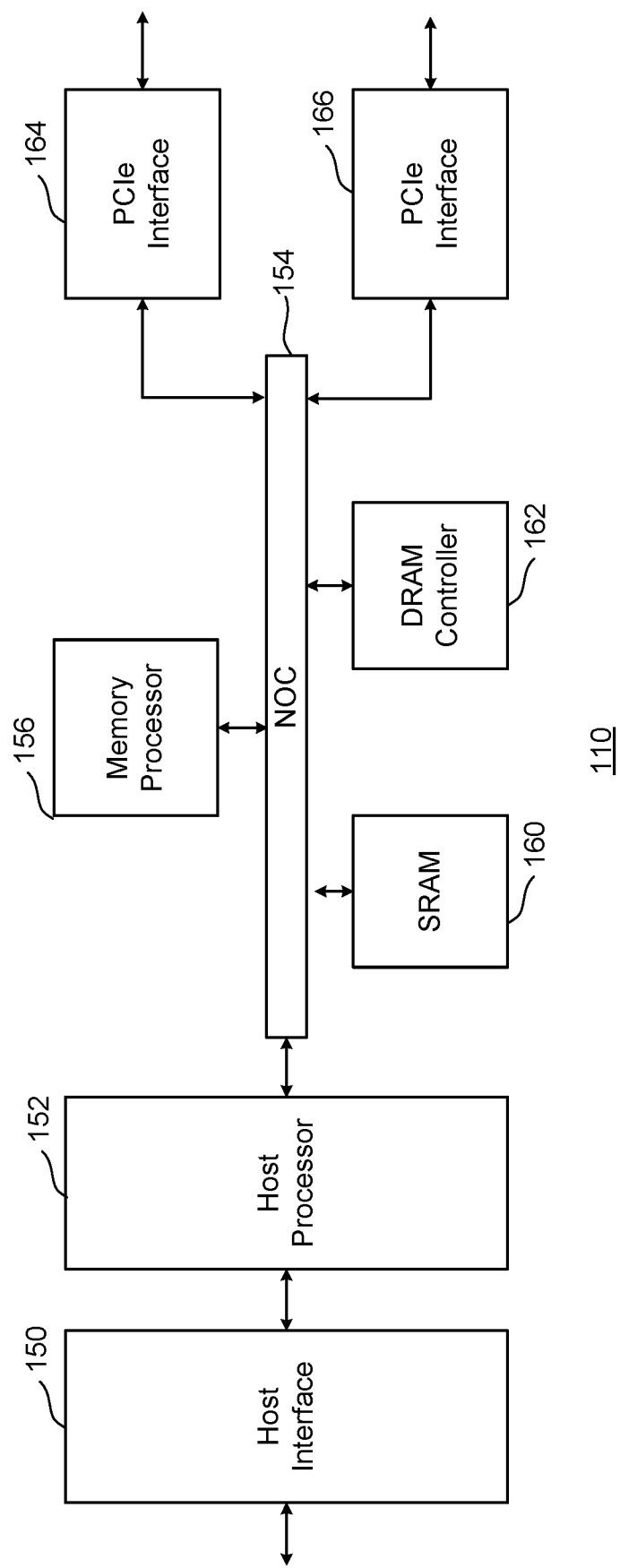
FIG. 1B is a block diagram of one embodiment of a Front-End Processor Circuit.

A non-volatile storage system is proposed for performing progressive writing of data. That is, existing data is overwritten by new data without the need to perform a traditional erase operation that changes the threshold voltage of the non-volatile memory cells back to the traditional or original erased state. In one example, new data is written on top of old data using shifted threshold voltage distributions. Some embodiments include writing MLC data over SLC data, using intermediate erase threshold voltage distributions and/or automatically detecting which threshold voltage distributions are currently being used to store data. By performing progressive writing of data without the need to perform a traditional erase operation that changes the threshold voltage of the non-volatile memory cells back to the traditional or original erased state, the programming/writing process is performed quicker and requires less space in the memory.

FIG. 1A is a block diagram of one embodiment of a storage system 100 connected to a host system 120. Storage system 100 can implement the technology disclosed herein. Many different types of storage systems can be used with the technology disclosed herein. Example storage systems include a SD Card or solid-state drive ("SSD"); however, other types of storage systems can also be used. Storage system 100 comprises a memory controller 102, one or more memory package 104 for storing data, and local memory (e.g. DRAM/ReRAM) 106. Memory controller 102 comprises a Front-End Processor Circuit (FEP) 110 and one or more Back-End Processor Circuits (BEP) 112. In one embodiment FEP 110 circuit is implemented on an ASIC. In one embodiment, each BEP circuit 112 is implemented on a separate ASIC. In one embodiment, the ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two-dimensional NAND flash memory and/or three-dimensional NAND flash memory). In other embodiments, the memory package 104 can include other types of memory; for example, the memory package can include Phase Change Memory (PCM) memory or Magnetoresistive Random Access Memory (MRAM).

In one embodiment, memory controller 102 communicates with host system 120 using an interface 130. For working with storage system 100, host system 120 includes a host processor 122, host memory 124, and interface 126, which communicate over bus 128. Host memory 124 is the host's physical memory, and can be DRAM, SRAM, non-volatile memory, or another type of storage. Host 120 may also include a hard disk drive connected to bus 128 and/or a USB drive in communication with bus 128. Software (code) for programming host processor 122 can be stored in host memory 124, a hard disk drive connected to bus 128 or a USB drive. Host memory 124, a hard disk drive connected to bus 128, and a USB drive are examples of non-transitory processor readable storage mediums that store processor readable code that when executed on host processor 122 cause host processor 122 to perform the methods described below.

Host system 120 is external to and separate from storage system 100. In one embodiment, storage system 100 is embedded in or connected to host system 120. Memory controller 102 may communicate with host 120 via various types of communication interfaces, including for example, SD Card interface. NVMe over PCIe, NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like.

FIG. 1B is a block diagram of one embodiment of FEP circuit 110. FIG. 1B shows a host interface 150 to communicate with host system 120 and a host processor 152. Host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106, which is a volatile memory). SRAM 160 is local volatile RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface 164/166 communicates with one of the BEP circuits 112. In other embodiments, there can be more or fewer than two BEP circuits 112; therefore, there can be more than two PCIe Interfaces.

Figure 1C:
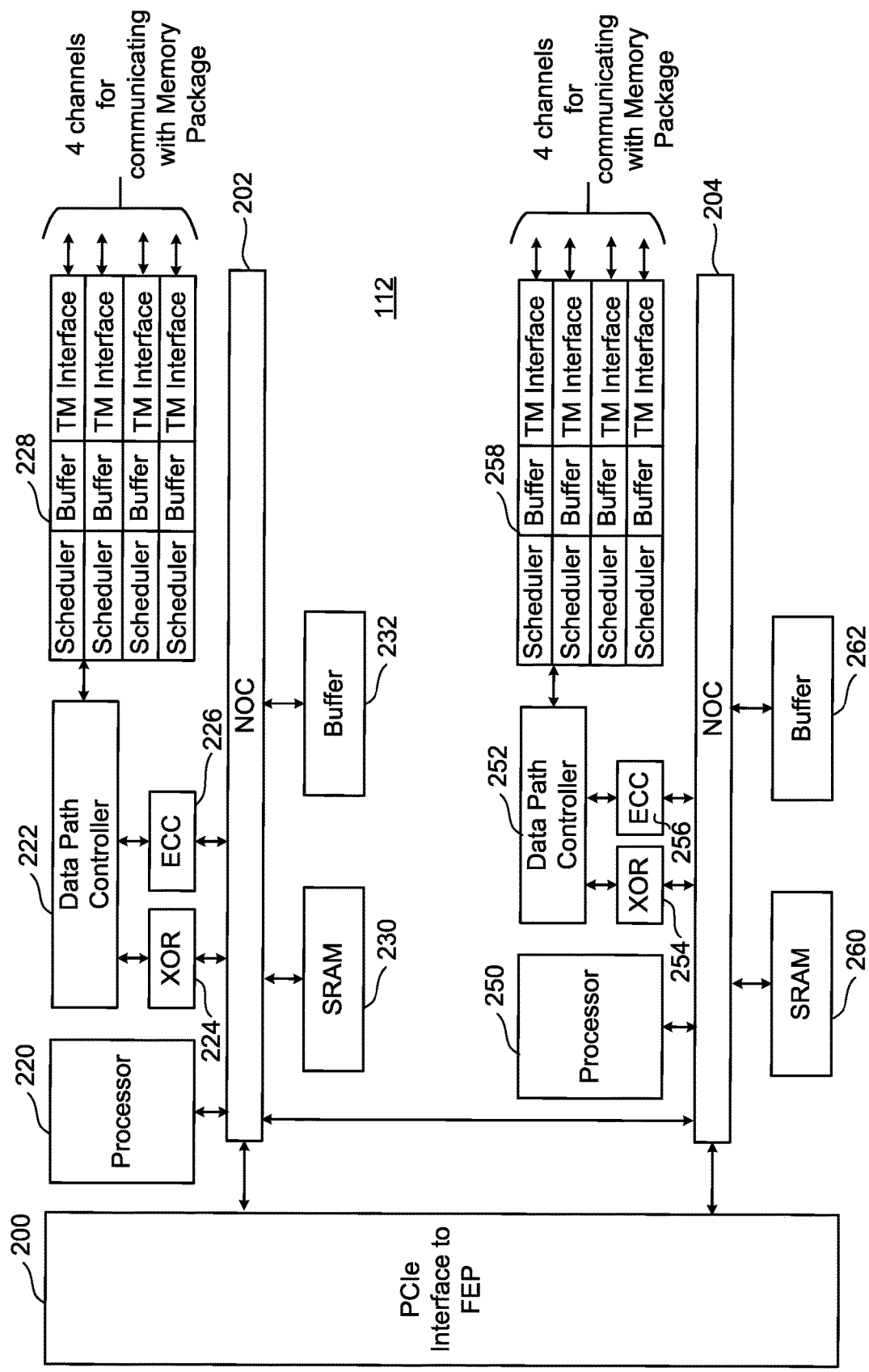
FIG. 1C is a block diagram of one embodiment of a Back-End Processor Circuit.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In one embodiment, the XOR engines 224/254 can recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with memory packages and the bottom NOC 204 is associated with memory interface 258 for four additional channels for communicating with memory packages. In one embodiment, each memory interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 1C. Additionally, controllers with structures different than FIGS. 1B and 1C can also be used with the technology described herein.

Figure 1D:
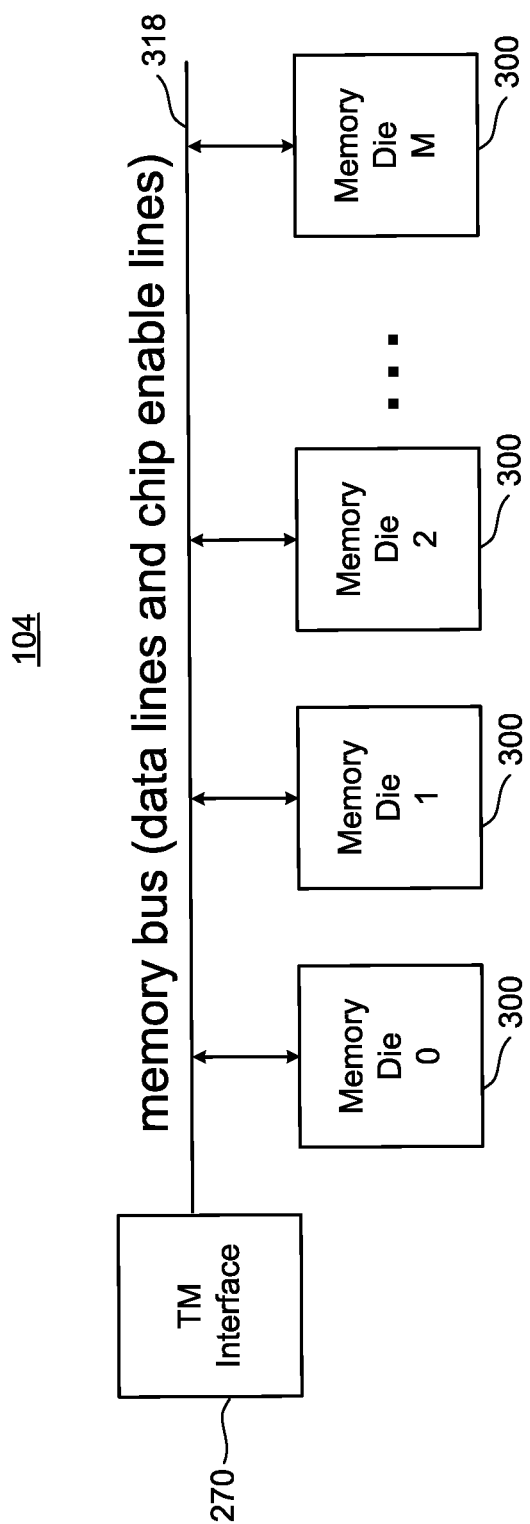
FIG. 1D is a block diagram of one embodiment of a memory package.

FIG. 1D is a block diagram of one embodiment of a memory package 104 that includes a plurality of memory dies 300 (Memory Die 0, Memory Die 1, Memory Die 2, ... Memory Die M) connected to a memory bus (data lines and chip enable lines) 318. The memory bus 318 connects to a Toggle Mode Interface 270 for communicating with the TM Interface of a BEP circuit 112 (see e.g., FIG. 1C). In some embodiments, the memory package can include a small controller connected to the memory bus 318 and the TM Interface 270. In total, the memory package 104 may have eight or 16 memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 2A:
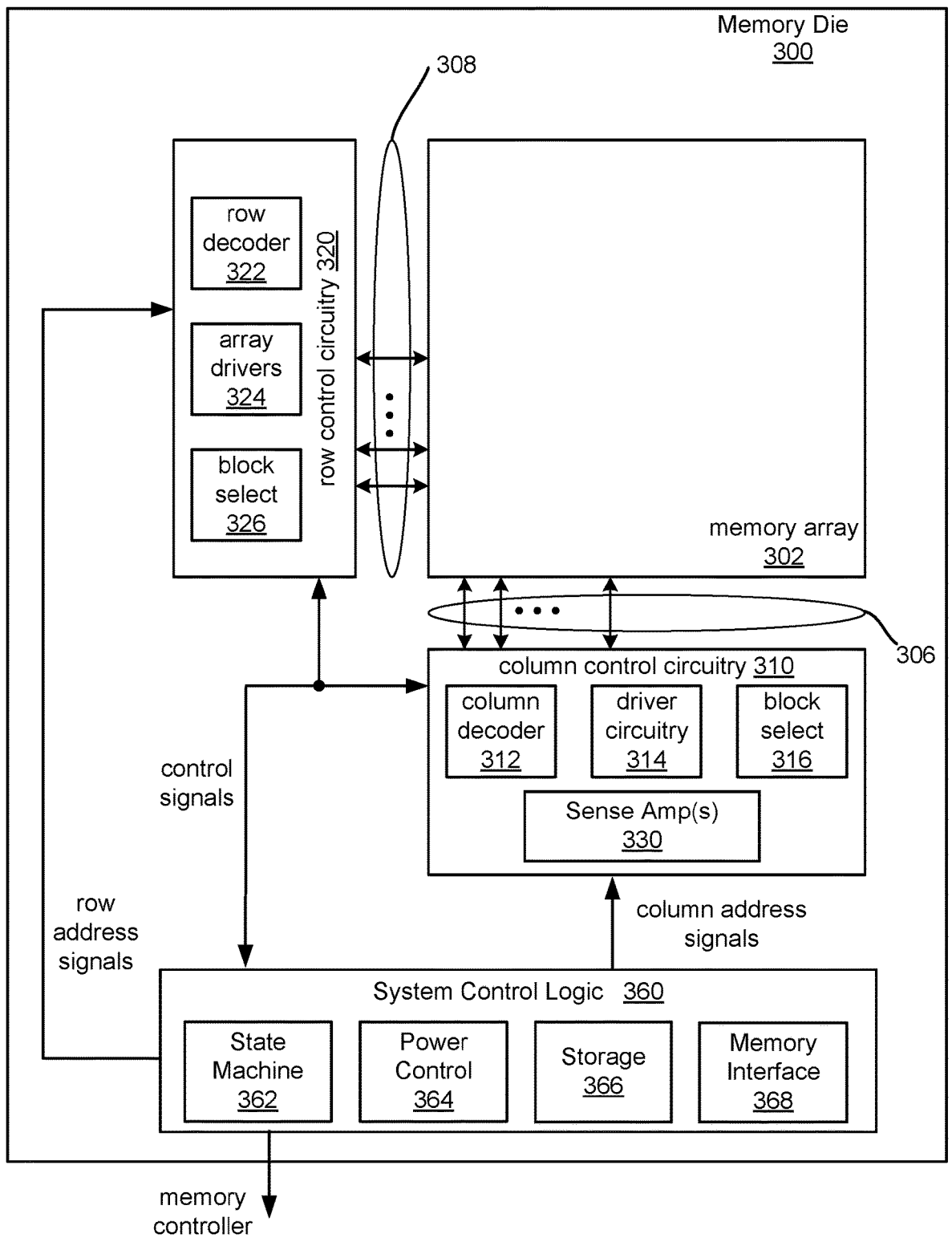
FIG. 2A is a functional block diagram of an embodiment of a memory die.

FIG. 2A is a block diagram that depicts one example of a memory die 300 that can implement the technology described herein. Memory die 300, which can correspond to one of the memory die 300 of FIG. 1D, includes a non-volatile memory array 302. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only single block is shown for array 302, a memory die can include multiple arrays and/or multiple planes that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from host 120 and provides output data and status to memory controller 102. In some embodiments, the system control logic 360 include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 that controls the power and voltages supplied to the rows and columns of the memory array 302 during memory operations and may include charge pumps and regulator circuit for creating regulating voltages. System control logic 360 includes storage 366, which may be used to store parameters for operating the memory array 302.

Commands and data are transferred between memory controller 102 and memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the memory controller 102.

In some embodiments, all the elements of memory die 300, including the system control logic 360, can be formed as part of a single die. In other embodiments, some or all of the system control logic 360 can be formed on a different die.

For purposes of this document, the phrase a "control circuit" includes any one or a combination of memory controller 102, state machine 362, a micro-controller, microprocessor, all of or a portion of system control logic 360, row control circuitry 320, column control circuitry 310 and/or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In one embodiment, memory structure 302 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory array 302. No particular non-volatile memory technology is required for purposes of the new claimed embodiments proposed herein. Other examples of suitable technologies for memory cells of the memory array (or other type of memory structure) 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts, the structure of memory array 302 and the peripheral circuitry, which (in some embodiments) includes all of the structures 310, 320 and 360 other than memory array 302. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functions that can be implemented on-chip. Consequently, a basic trade-off in the design of a memory die for the storage system 100 is the amount of area to devote to the memory structure 302 and the amount of area to devote to the peripheral circuitry.

Another area in which the memory array 302 and the peripheral circuitry are often at odds is in the processing involved in forming these regions, since these regions often involve differing processing technologies resulting in trade-offs in having differing technologies on a single die. For example, when the memory array 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory array 302 can be formed on one die (the memory die) and some or all of the peripheral circuitry elements, including one or more control circuits, can be formed on a separate die (the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one control die, other embodiments can use more die, such as two memory die and one peripheral circuitry die, for example.

Figure 2B:
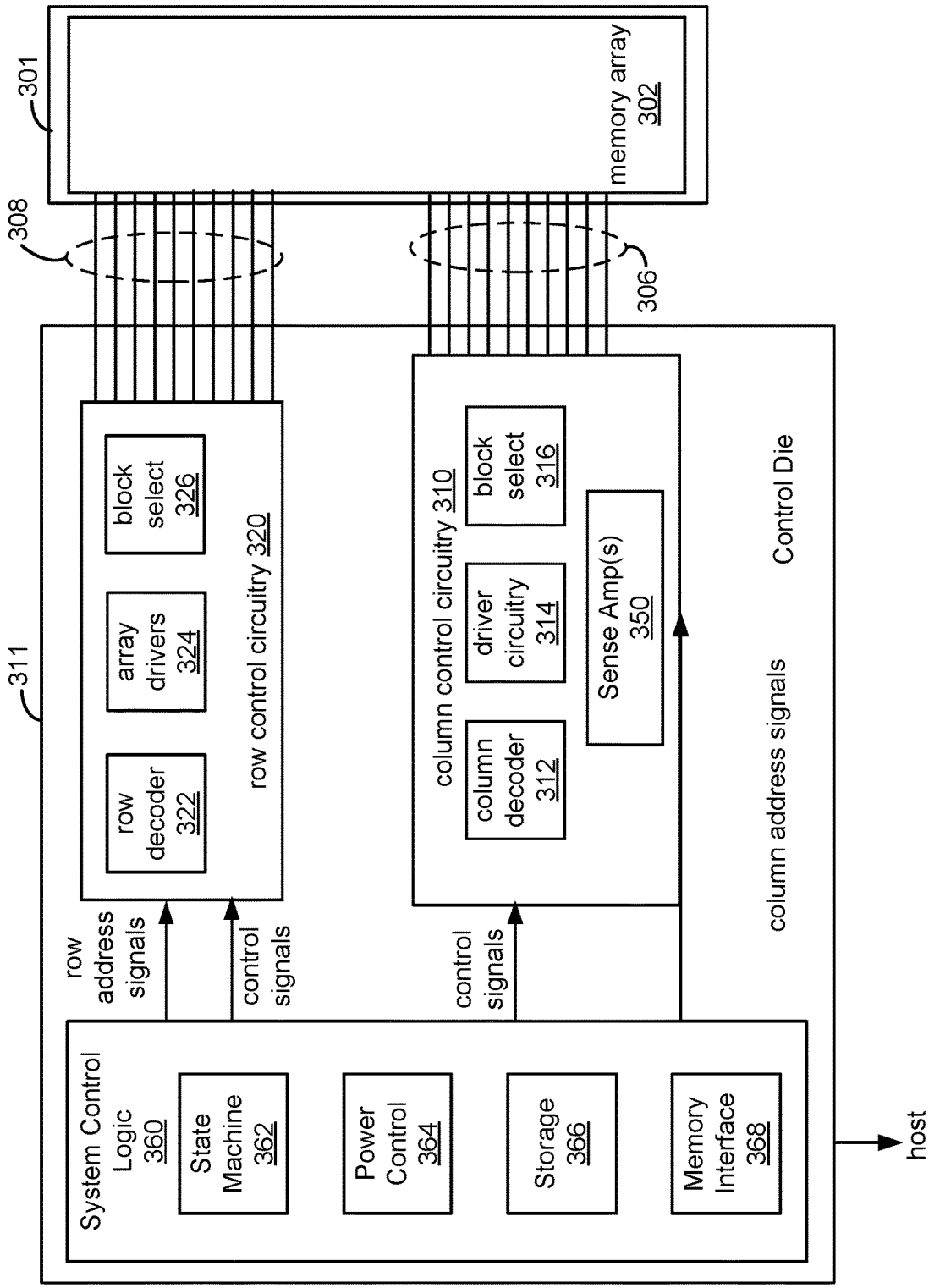
FIG. 2B is a functional block diagram of an embodiment of an integrated memory assembly.

FIG. 2B shows an alternative arrangement to that of FIG. 2A which may be implemented using wafer-to-wafer bonding to provide a bonded die pair, referred to as an integrated memory assembly. FIG. 2B depicts a functional block diagram of one embodiment of an integrated memory assembly 307. One or more integrated memory assemblies 307 may be used in a memory package 104 in storage system 100. The integrated memory assembly 307 includes two types of semiconductor die (or more succinctly, "die"). Memory die 301 includes memory array 302. Memory array 302 may contain non-volatile memory cells. A portion of memory array 302 is used to store boot code 350. Boot code 350 is used by host processor 124 to perform the boot process, as described above.

Control die 311 includes control circuitry 310, 320 and 360 (details of which are discussed above). In some embodiments, control die 311 is configured to connect to the memory array 302 in the memory die 301. FIG. 2B shows an example of the peripheral circuitry, including the control circuit(s), formed in a peripheral circuit or control die 311 coupled to memory array 302 formed in memory die 301. Common components are labelled similarly to FIG. 2A. System control logic 360, row control circuitry 320, and column control circuitry 310 are located in control die 311. In some embodiments, all or a portion of the column control circuitry 310 and all or a portion of the row control circuitry 320 are located on the memory die 301. In some embodiments, some of the circuitry in the system control logic 360 is located on the on the memory die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate memory controller 102 may also be used to fabricate system control logic 360, row control circuitry 320, and column control circuitry 310). Thus, while moving such circuits from a die such as memory die 301 may reduce the number of steps needed to fabricate such a die, adding such circuits to a die such as control die 311 may not require many additional process steps.

FIG. 2B shows column control circuitry 310 including sense amplifier(s) 350 on the control die 311 coupled to memory array 302 on the memory die 301 through electrical paths 306. For example, electrical paths 306 may provide electrical connection between column decoder 312, driver circuitry 314, and block select 316 and bit lines of memory array (or structure) 302. Electrical paths may extend from column control circuitry 310 in control die 311 through pads on control die 311 that are bonded to corresponding pads of the memory die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory array 302 through electrical paths 308. Each of electrical path 308 may correspond to a word line, dummy word line, or select gate line. Additional electrical paths may also be provided between control die 311 and memory structure die 301.

In some embodiments, there is more than one control die 311 and/or more than one memory die 301 in an integrated memory assembly 307. In some embodiments, the integrated memory assembly 307 includes a stack of multiple control die 311 and multiple memory die 301. In some embodiments, each control die 311 is affixed (e.g., bonded) to at least one of the memory structure dies 301.

Figure 2C:
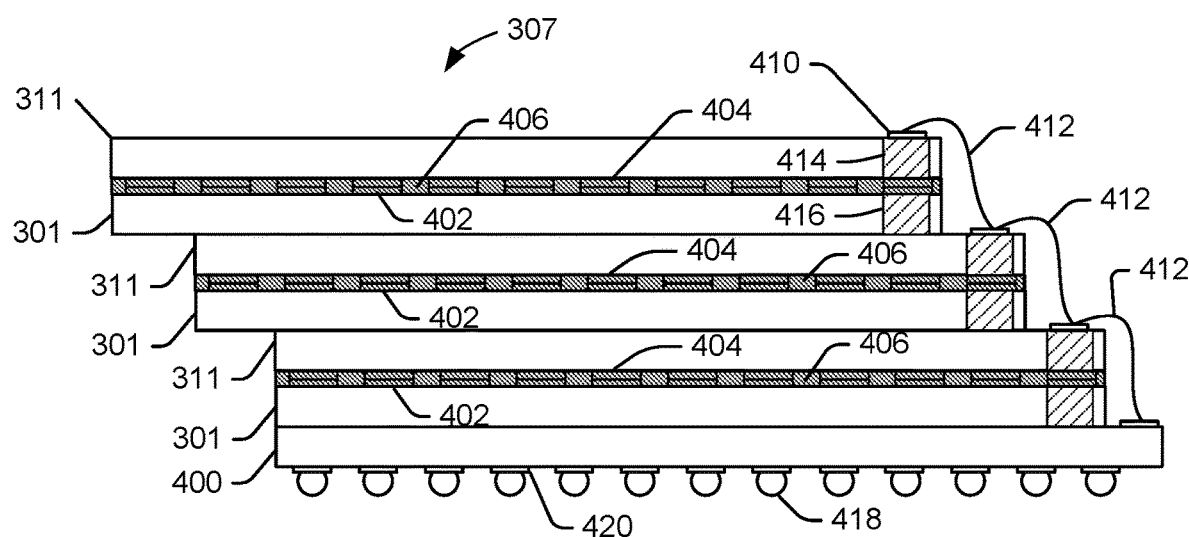
FIG. 2C depicts one embodiment of an integrated memory assembly.

As noted herein, there may be more than one control die 311 and more than one memory die 301 in an integrated memory assembly 307. In some embodiments, the integrated memory assembly 307 includes a stack of multiple control die 311 and multiple memory die 301. FIG. 2C depicts a side view of one embodiment of an integrated memory assembly 307 stacked on a substrate 400. The integrated memory assembly 307 has three control die 311 and three memory die 301. Each control die 311 is bonded to one of the memory die 301. Some of the bond pads 402, 404 are depicted. There may be many more bond pads. A space between two dies 301, 311 that are bonded together is filled with a solid layer 406, which may be formed from epoxy, other resin or polymer. This solid layer 406 protects the electrical connections between the dies 301 and 311, and further secures the dies together. Various materials may be used as solid layer 406, but in embodiments, it may be Hysol epoxy resin from Henkel Corp., having offices in California, USA.

The integrated memory assembly 307 may for example be stacked with a stepped offset, leaving bond pads 410 at each level uncovered and accessible from above. Wire bonds 412 connected to the bond pads 410 connect the control die 311 to the substrate 400. A number of such wire bonds may be formed across the width of each control die 311 (i.e., into the page of FIG. 2C).

A through silicon via (TSV) 414 may be used to route signals through a control die 311. A through silicon via (TSV) 416 may be used to route signals through a memory die 301. The TSVs 414, 416 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

In regard to one embodiment of the implementation depicted in FIG. 2C, the various depicted TSV 414 and 416, connected to the bond pads 410 and wire bonds 412, may be used so that multiple control die 311 can communicate with each other and multiple control die 311 can transmit data between each other so, for example, a first control die can read data from its bonded memory die, transfer that data (after some optional processing) to a second control die and the second control die can program that data into the memory die bonded to the second control die.

Solder balls 418 may optionally be affixed to contact pads 420 on a lower surface of substrate 400. The solder balls 418 may be used to electrically and mechanically couple the integrated memory assembly 307 to a printed circuit board. Solder balls 418 may be omitted where the integrated memory assembly 307 is to be used as an LGA package. The solder balls 418 may form a part of the interface between the integrated memory assembly 307 and memory controller 102.

In the embodiment of FIG. 2C, the memory dies 301 and the control dies 311 are arranged as pairs. That is, each memory die 301 is bonded to and in communication with a corresponding/matching/paired control die 311. In other embodiments, a control die may be bonded (or otherwise connected) to more than one memory die.

Figure 3A:
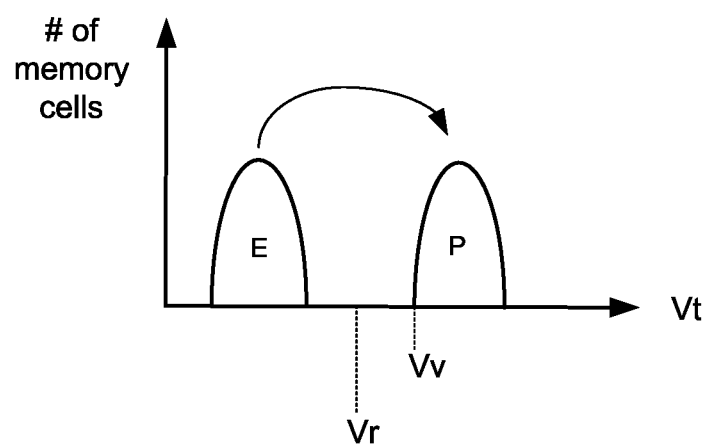
FIGS. 3A-D depict graphs of threshold voltage distributions.

At the end of a successful programming process, the threshold voltages of the memory cells should be within one or more distributions of threshold voltages for programmed memory cells or within a distribution of threshold voltages for erased memory cells, as appropriate. FIG. 3A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 3A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 3A depicts read reference voltage Vr. By testing (e.g., performing sense operations) whether the threshold voltage of a given memory cell is above or below Vr, the system can determine a memory cells is erased (state E) or programmed (state P). FIG. 3A also depicts verify reference voltage Vv. In some embodiments, when programming memory cells to data state P, the system will test whether those memory cells have a threshold voltage greater than or equal to Vv.

Figure 3B:
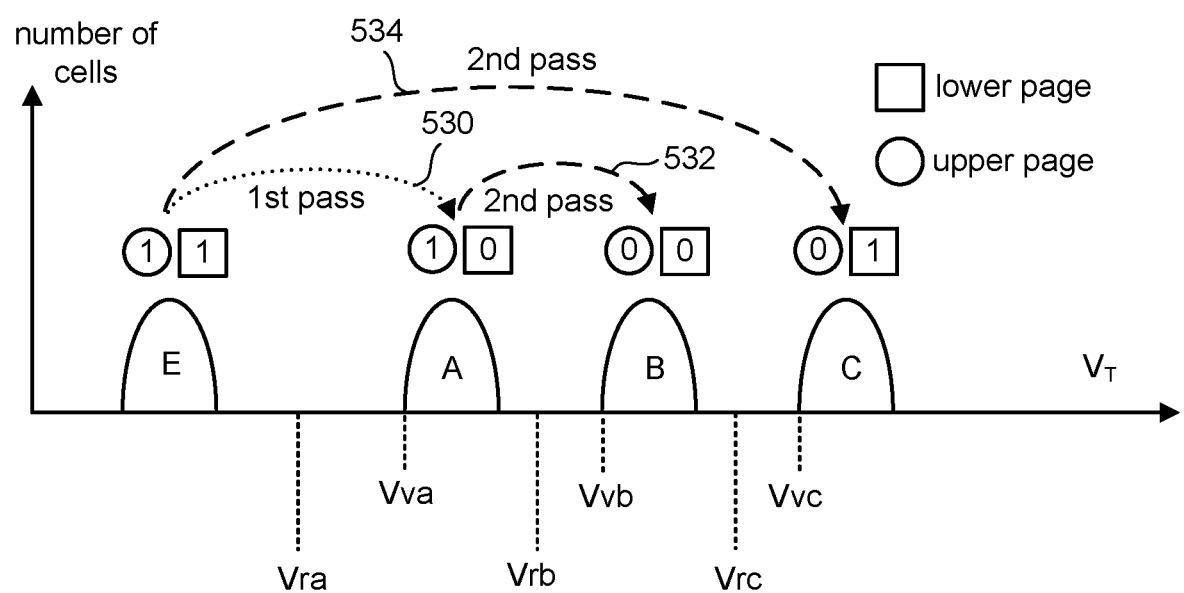
Figure 3C:
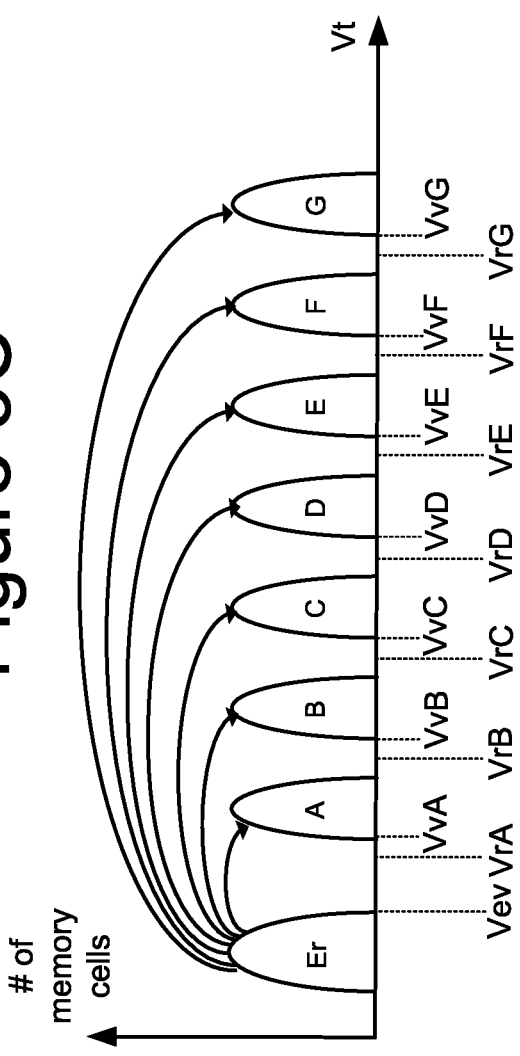
Figure 3D:
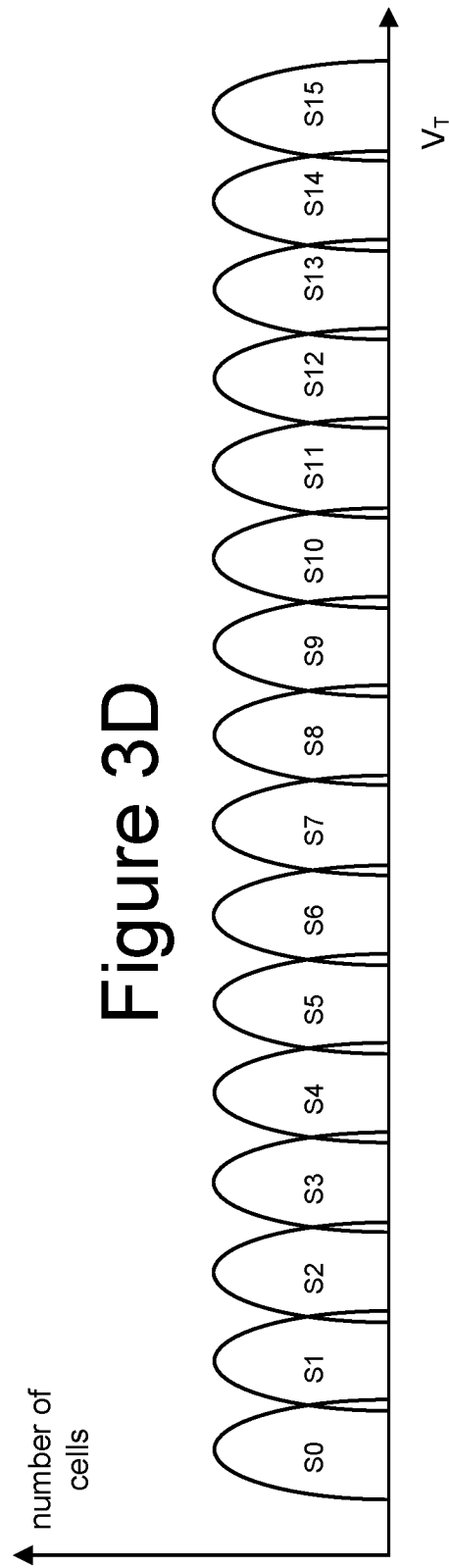

FIGS. 3B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 3B, each memory cell stores two bits of data. Other embodiments may use other data capacities per memory cell (e.g., such as three, four, or five bits of data per memory cell).

FIG. 3B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 3B corresponds to predetermined values for the set of data bits. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

FIG. 3B illustrates an example of a two-pass technique of programming a MLC data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the memory cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 530. That concludes the first programming pass.

In a second programming pass, the memory cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the memory cell is programmed so that the threshold voltage is increased to be within state C, as depicted by arrow 534. If the memory cell had been programmed into state A as a result of the first programming pass, then the memory cell is further programmed in the second pass so that the threshold voltage is increased to be within state B, as depicted by arrow 532. The result of the second pass is to program the memory cell into the state designated to store a logic "0" for the upper page without changing the data for the lower page.

FIG. 3C depicts example threshold voltage distributions for memory cells where each memory cell stores three bits of data per memory cells (which is another example of MLC data). FIG. 3C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme.

TABLE 2

|    | Er | A | B | C | D | E | F | G |
|----|----|----|----|----|----|----|----|----|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 3C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 3C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 17B also shows Vev, which is a voltage level to test whether a memory cell has been properly erased.

In one embodiment, known as full sequence programming, memory cells can be programmed from the erased data state Er directly to any of the programmed data states A-G using the process of FIG. 4 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 3C represent the full sequence programming. In some embodiments, data states A-G can overlap, with control die 311 and/or memory controller 102 relying on error correction to identify the correct data being stored.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 3C) or verify operation (e.g. see verify target levels VvA, VvB, VvC, VvD, VvE, VvF, and VvG of FIG. 3C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 3D depicts threshold voltage distributions when each memory cell stores four bits of data, which is another example of MLC data. FIG. 3D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. When using four bits per memory cell, the memory can be programmed using the full sequence programming discussed above, or multi-pass programming processes known in the art. Each threshold voltage distribution (data state) of FIG. 3D corresponds to predetermined values for the set of data bits. The specific relationship between the data programmed into the memory cell and the threshold voltage levels of the cell depends upon the data encoding scheme adopted for the cells. Table 3 provides an example of an encoding scheme.

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1 | 1 | 1 | 1 | 1 | 0 | 0 | 0 | 0 | 0 | 1 | 1 | 0 | 0 | 0 | 1 |
| UP | 1 | 1 | 0 | 0 | 0 | 0 | 0 | 0 | 1 | 1 | 1 | 1 | 1 | 1 | 0 | 0 |

TABLE 3-continued

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   | where TP = Top Page, UP = Upper Page, MP = Middle Page and LP = Lower Page

Figure 4:
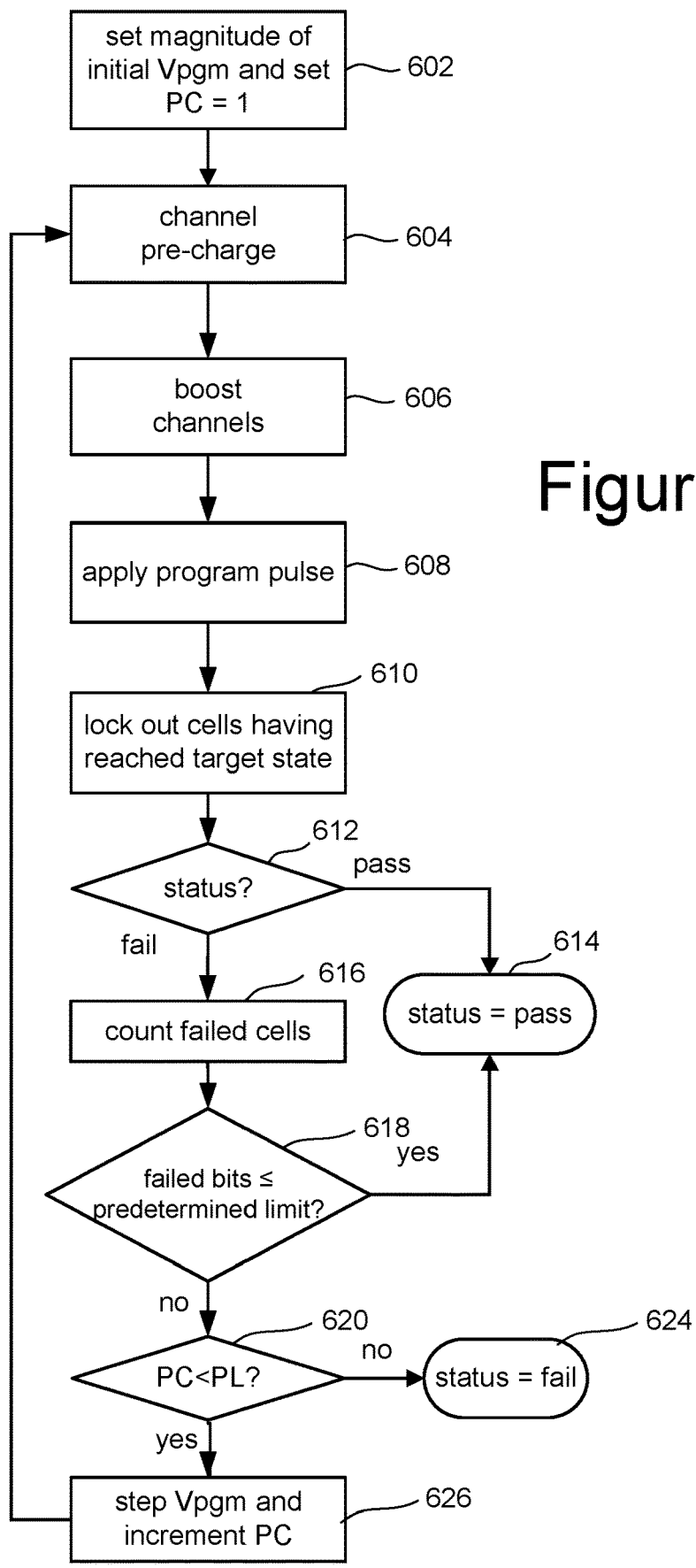
FIG. 4 is a flow chart describing one embodiment of a process for programming/writing data.

FIG. 4 is a flowchart describing one embodiment of a process for programming memory cells. For purposes of this document, the term program and programming are synonymous with write and writing. In one example embodiment, the process of FIG. 4 is performed memory array 302 using the control circuitry 310 discussed above. For example, the process of FIG. 4 can be performed at the direction of state machine 362. In one embodiment, the process of FIG. 4 is used to program a codeword into memory array 302. In some embodiments, the process of FIG. 4 is performed by control die 311 to program memory cells on the memory die.

Figure 11:
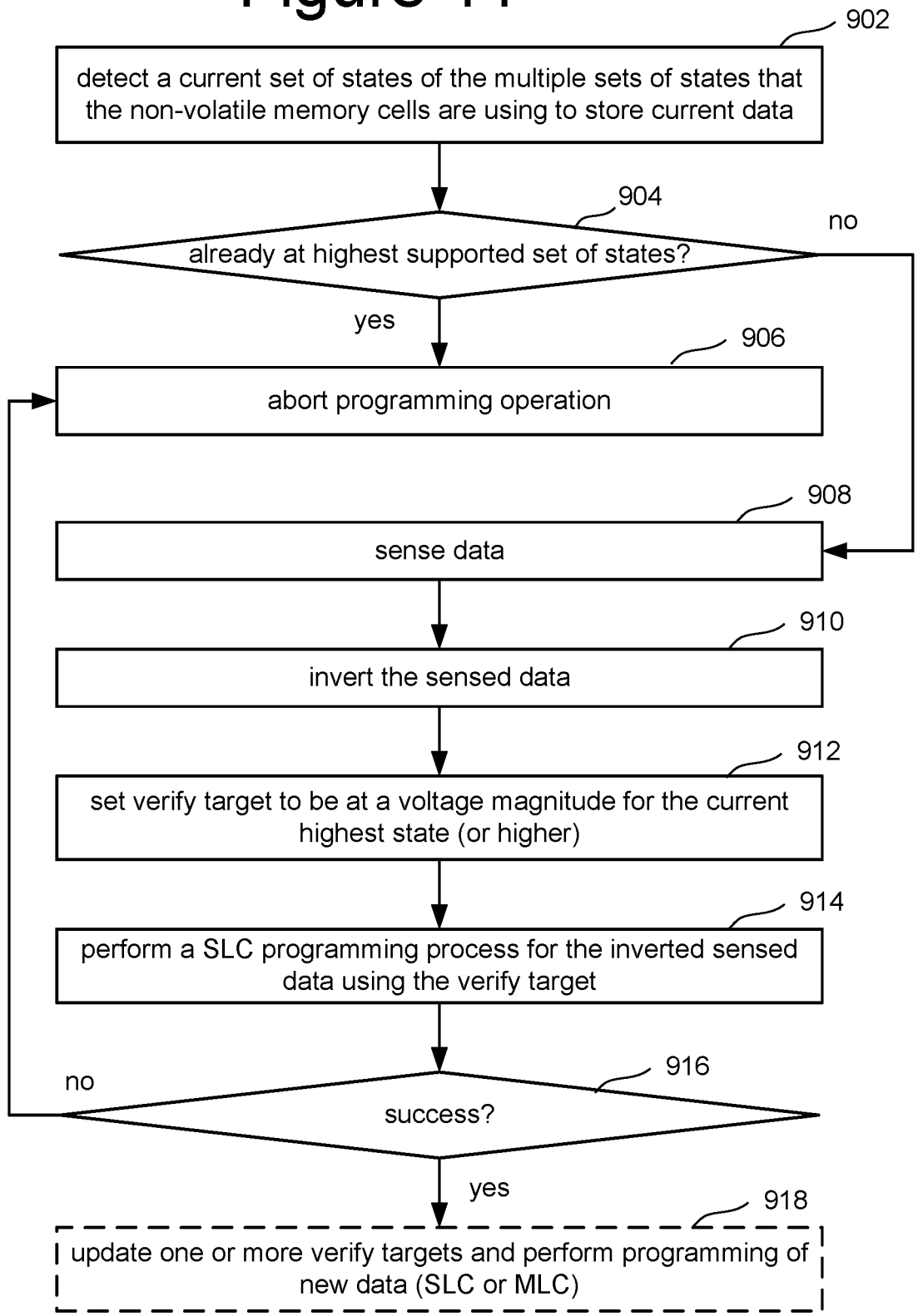
FIG. 11 is a flow chart describing one embodiment of a process for progressively writing data such that existing data is overwritten by new data without the need to perform a traditional erase operation that changes the threshold voltage of the non-volatile memory cells back to the traditional or original erased state.

In step 602 of FIG. 11, the programming voltage signal (Vpgm) is initialized to the starting magnitude (e.g., ~12-16V or another suitable level) and a program counter PC maintained by state machine 362 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program pulse of the programming voltage signal Vpgm is applied to the selected word line (the word line selected for programming) by the control die. If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, memory cells that have reached their target states are locked out from further programming by the control die. Step 610 may include performing verifying at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 362, memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size (e.g., a step size of 0.1-1.0 volts). After step 626, the process loops back to step 604 and another program pulse is applied to the selected word line (by the control die) so that another iteration (steps 604-626) of the programming process of FIG. 4 is performed.

The programming process of FIG. 4 can be used to program SLC data as per FIG. 3A, each pass of FIG. 3B to program MLC data, full sequence programming of FIG. 3C to program MLC data and each pass of another multi-pass programming process.

In one embodiment, erasing is the process of changing the threshold voltage of one or more memory cells from a programmed data state to an erased data state. For example, changing the threshold voltage of one or more memory cells from state P to state E of FIG. 3A, from states A/B/C to state E of FIG. 3B, from states A-G to state Er of FIG. 3C or from states S1-S15 to state S0.

The erasing process is typically performed at the block level. On the other hand, programming is performed at the page or sub-page level (a block comprises many pages). Therefore, when traditional non-volatile memory systems overwrite data in a particular page of a particular block, all of the valid data in the pages of the particular block other than the particular page is moved and re-programmed to a new block. The new data is also programmed to the new block. After the moving and re-programming to the new block, the particular block is then erased and made available for future programming. The moving and re-programming of the valid data slows down the programming process and uses extra space in the memory (as an area of the memory must be kept available for moving and re-programming data).

To address these issues, it is proposed to perform progressive writing of data. That is, existing data is overwritten by new data without the need to perform a traditional erase operation that changes the threshold voltage of the non-volatile memory cells back to the traditional or original erased state. In one example, new data is written on top of old data using shifted threshold voltage distributions. By performing progressive writing of data without the need to perform a traditional erase operation that changes the threshold voltage of the non-volatile memory cells back to the traditional or original erased state, the programming/writing process is performed quicker and requires less space in the memory.

Figure 5:
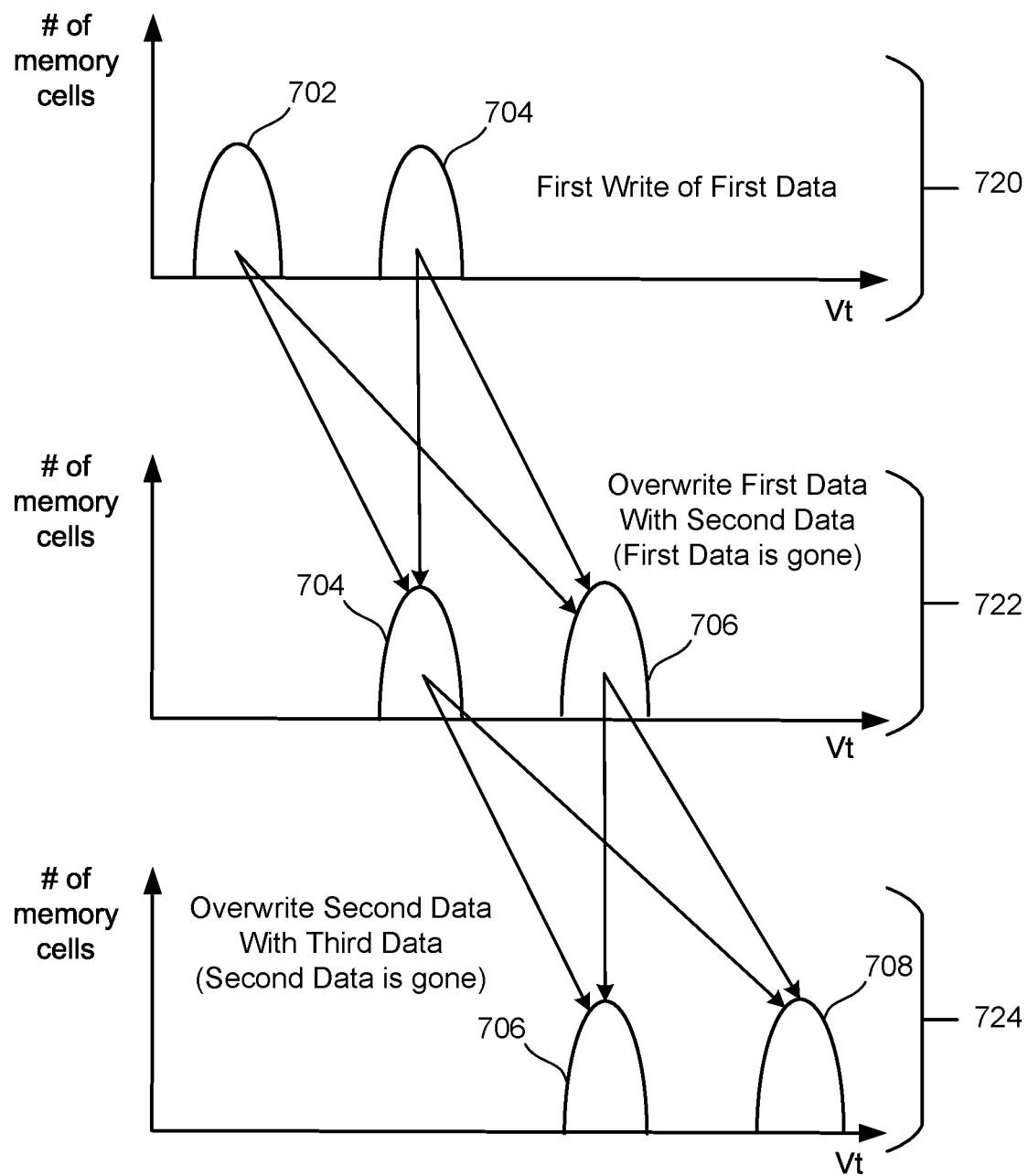
FIGS. 5 and 6 depict graphs of threshold voltage distributions.

FIG. 5 depicts one example of the process of progressively writing data such that existing data is overwritten by new data without the need to perform a traditional erase operation that changes the threshold voltage of the non-volatile memory cells back to the traditional or original erased state. In the embodiment of FIG. 5, existing SLC data is overwritten by new SLC data without performing a traditional erase operation. FIG. 5 shows three graphs 720, 722 and 724, each of which plots number of memory cells versus threshold voltage. Initially, all of the data is in an initial erase state, corresponding to threshold voltage distribution 702 (which can also be referred to as state 702). A First Write process, which writes First Data, causes the memory cells to be distributed between state 702 and state 704, both of which are threshold voltage distributions. For example, those memory cells storing data "1" will remain in state 702 and those memory cells storing data "0" will be moved by the writing (e.g., programming) process to state 704.

After performing the First Write process, Second Data is received for a Second Write. It is intended that the Second Data overwrites the First Data. For purposes of this document, overwriting existing data means to remove and replace the existing data. In the past, that meant that the memory cells are first erased such that all of the memory cells are returned to the initial erased state 702 and then the Second Data is written to the memory cells. However, the embodiment of FIG. 5 shows the Second Write (from graph 720 to graph 722) to comprise overwriting the First Data with the Second Data such that the First Data is gone and the memory cells were not returned to the initial erased state 702. The Second Write is performed using shifted threshold voltage distributions 704 and 706. For example, those memory cells storing data "1" will be in state 704 and those memory cells storing data "0" will be in state 706. More specifically, those memory cells that were in state 702 due to the First Write and are being overwritten with data "1" are moved to state 704. Those memory cells that were in state 702 due to the First Write and are being overwritten with data "0" are moved to state 706. Those memory cells that were in state 704 due to the First Write and are being overwritten with data "1" remain in state 704. Those memory cells that were in state 704 due to the First Write and are being overwritten with data "0" are moved to state 706. At the end of the Second Write, state 702 is no longer being used by these memory cells.

After performing the Second Write process, Third Data is received for a Third Write. It is intended that the Third Data overwrites the Second Data. A Third Write process (from graph 722 to graph 724) comprises overwriting the Second Data with the Third Data, such that the Second Data is gone and the memory cells were not returned to the initial erased state 702. The Third Write is performed using shifted threshold voltage distributions 706 and 708. For example, those memory cells storing data "1" will be in state 706 and those memory cells storing data "0" will be in state 708. More specifically, those memory cells that were in state 704 due to the Second Write and are being overwritten with data "1" are moved to state 706. Those memory cells that were in state 704 due to the Second Write and are being overwritten with data "0" are moved to state 708. Those memory cells that were in state 706 due to the Second Write and are being overwritten with data "1" remain in state 706. Those memory cells that were in state 706 due to the Second Write and are being overwritten with data "0" are moved to state 708. At the end of the Third Write, states 702 and 704 are no longer being used by these memory cells.

In some embodiments, the memory can keep writing to progressively higher states. In some embodiments, the number of states is capped at a finite number (e.g., 3, 4, 5, 8, 16). After data is written to the highest state allowed, then the next time new data needs to be written, the memory will first erase back to the initial erase state (e.g., state 702) and then program the new data.

Note that the Second Write uses one of the states that is also used for the First Write, namely state 704. In another embodiment, successive writes use new sets of states. For example, in one embodiment, the Second Write would cause the memory cells to be in states 706 and 708, and the Third Write would use states that have threshold voltage ranges higher in voltage magnitude than state 708.

Figure 6:
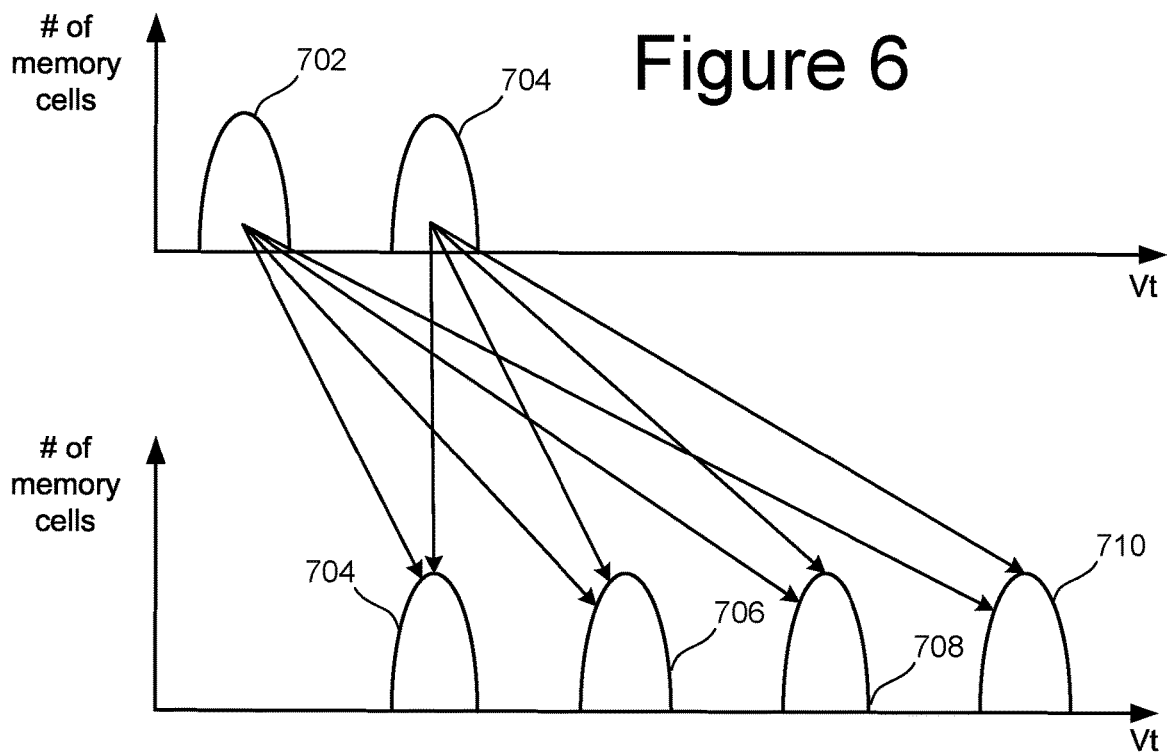

FIG. 6 depicts another example of the process of progressively writing data such that existing data is overwritten by new data without the need to perform a traditional erase operation that changes the threshold voltage of the non-volatile memory cells back to the traditional or original erased state. FIG. 6 shows graphs that plot number of memory cells versus threshold voltage. In the embodiment of FIG. 6, existing SLC data is overwritten by new MLC data without performing perform a traditional erase operation. Before writing to the memory cell, the memory cells are in the initial erased state 702. A First Write process, which writes First Data, causes the memory cells to be distributed between state 702 and state 704, both of which are threshold voltage distributions. For example, those memory cells storing data "1" will remain in state 702 and those memory cells storing data "0" will be moved by the writing (e.g., programming) process to state 704. Other encodings of data to states can also be used.

After performing the First Write process, Second Data is received for a Second Write. It is intended that the Second Data overwrite the First Data such that the First Data is gone and the memory cells were not returned to the initial erased state 702. The Second Write is performed using shifted threshold voltage distributions 704, 706, 708 and 710. In the example of FIG. 6, the Second Data comprises two bits of data per memory cell; therefore, four data states are used. In other embodiments, the Second Data comprises more than two bits of data per memory such that the Second Data is programmed to more than four states.

In one example of FIG. 6, those memory cells storing data "11" are in state 704, those memory cells storing data "10" are in state 706, those memory cells storing data "00" are in state 708, those memory cells storing data "01" are in state 710. More specifically, those memory cells that were in state 702 due to the First Write and are being overwritten with data "11" are moved to state 704, those memory cells that were in state 702 due to the First Write and are being overwritten with data "10" are moved to state 706, those memory cells that were in state 702 due to the First Write and are being overwritten with data "00" are moved to state 708, those memory cells that were in state 702 due to the First Write and are being overwritten with data "01" are moved to state 710, those memory cells that were in state 704 due to the First Write and are being overwritten with data "11" remain state 704, those memory cells that were in state 704 due to the First Write and are being overwritten with data "10" are moved to state 706, those memory cells that were in state 704 due to the First Write and are being overwritten with data "00" are moved to state 708, and those memory cells that were in state 704 due to the First Write and are being overwritten with data "01" are moved to state 710. In the embodiment of FIG. 6, existing SLC data is overwritten by new MLC data. In other embodiments, existing MLC data can be overwritten with SLC data.

Figure 7:
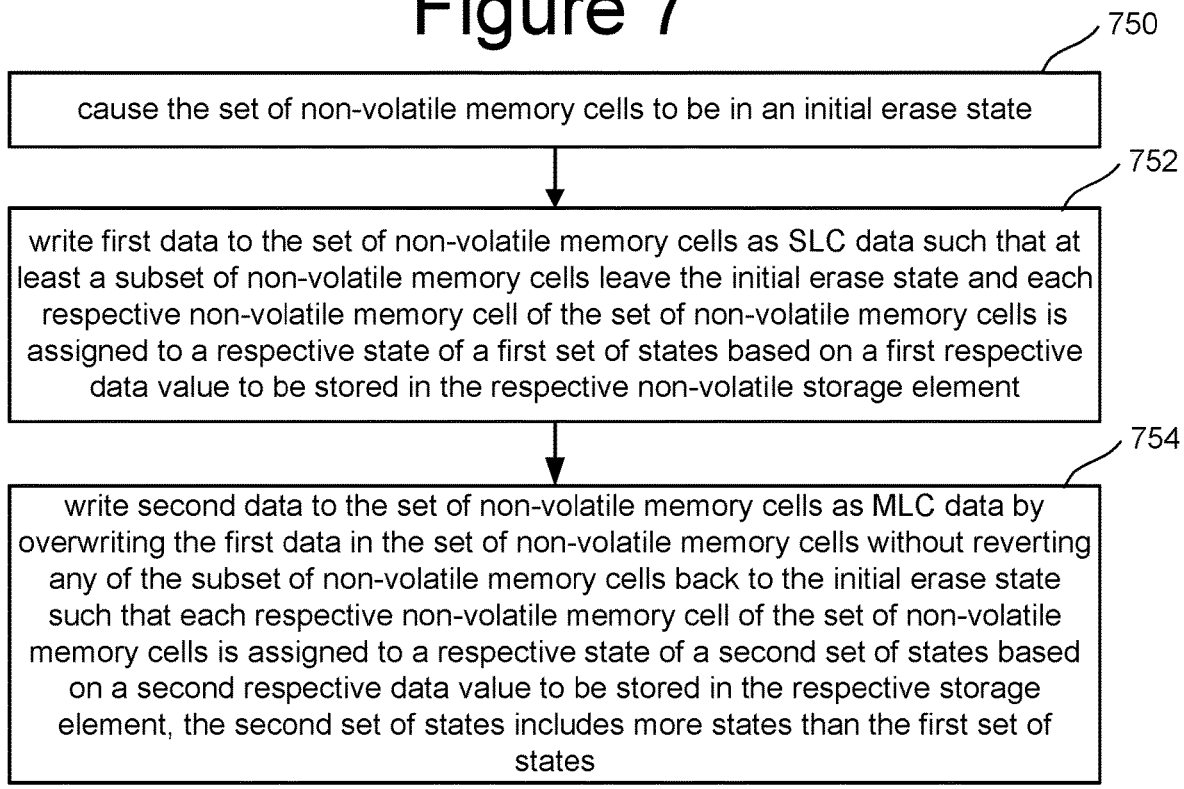
FIG. 7 is a flow chart describing one embodiment of a process for progressively writing data such that existing data is overwritten by new data without the need to perform a traditional erase operation that changes the threshold voltage of the non-volatile memory cells back to the traditional or original erased state.

FIG. 7 is a flow chart describing one embodiment of a process for progressively writing data such that existing data is overwritten by new data without the need to perform a traditional erase operation that changes the threshold voltage of the non-volatile memory cells back to the traditional or original erased state. The process of FIG. 7 describes the embodiments of existing SLC data being overwritten by new MLC data without performing perform a traditional erase operation. Thus, the process of FIG. 7 can be used to implement the technique depicted in FIG. 6. The process of FIG. 7 can be implemented by any of the control circuits described above. For example, the process of FIG. 7 can be performed by or at the control of memory controller 102 and/or state machine 362 (or a processor on-board the memory die).

In step 750 of FIG. 7, the non-volatile memory cells are caused to be in the initial erase state. For example, the population of memory cells can be erased such that they are all in state 702. Step 752 includes writing first data to the set of non-volatile memory cells as SLC data such that at least a subset of non-volatile memory cells leave the initial erase state (e.g., 702) and each respective non-volatile memory of the set of non-volatile memory cells is assigned to a respective state of a first set of states based on a first respective data value to be stored in the respective non-volatile memory cell. That is, the subset of non-volatile memory cells leaves the initial erase state (e.g., 702) to be in the state 704 and each memory cell is assigned to one of state 702 or 704 based on the data to be stored.

Step 754 includes writing second data to the set of non-volatile memory cells as MLC data by overwriting the first data in the set of non-volatile memory cells without reverting any of the subset of non-volatile memory cells back to the initial erase state such that each respective non-volatile memory cell of the set of non-volatile memory cells is assigned to a respective state of a second set of states based on a second respective data value to be stored in the respective memory cell. For example, the memory cells are reassigned from states 702/704 (storing SLC data-0 or 1) to states 704/706/708/710 (MLC data storing 11, 10, 00, or 01). The second set of states (704/706/708/710) includes more states than the first set of states (702/704). The overwriting the first data comprises removing and replacing the first data with the second data. In one example implementation of FIG. 7, each state of the first set of states (e.g., 702/704) is associated with a corresponding range of threshold voltages, the first set of states includes a lowest state (e.g., 702) associated with a lowest range of threshold voltages and a highest state (e.g., 704) associated with a highest range of threshold voltages for the first set of states, each state of the second set of states (704/706/708/710) is associated with a corresponding range of threshold voltages such that all of the threshold voltages for the second set of states are higher in voltage magnitude than threshold voltages for the lowest state (e.g., 704/706/708/710 are higher in voltage magnitude than 702) and at least a subset of the threshold voltages for the second set of states (e.g., associated with 706/708/710) are higher in voltage magnitude than all of the threshold voltages for the first set of states.

In one example implementation of FIG. 7, the control circuit is configured to overwrite the first data in the set of non-volatile memory cells by raising threshold voltages for at least a subset of the set of non-volatile memory cells without lowering threshold voltage for any of the set of non-volatile memory cells. That is, while performing progressive writes, threshold voltages will increase or remain constant but will not be intentionally lowered.

In one example implementation of FIG. 7, the control circuit is configured to write the first data to the set of non-volatile memory cells as SLC data by causing the set of non-volatile memory cells to store one bit of data in any one of two states 702/704 of the first set of states and the control circuit is configured to overwrite the first data by causing the set of non-volatile memory cells to store two or more bits of data in any one of four or more states 704/706/708/710 of the second set of states (e.g., as depicted in FIG. 6).

Figure 8:
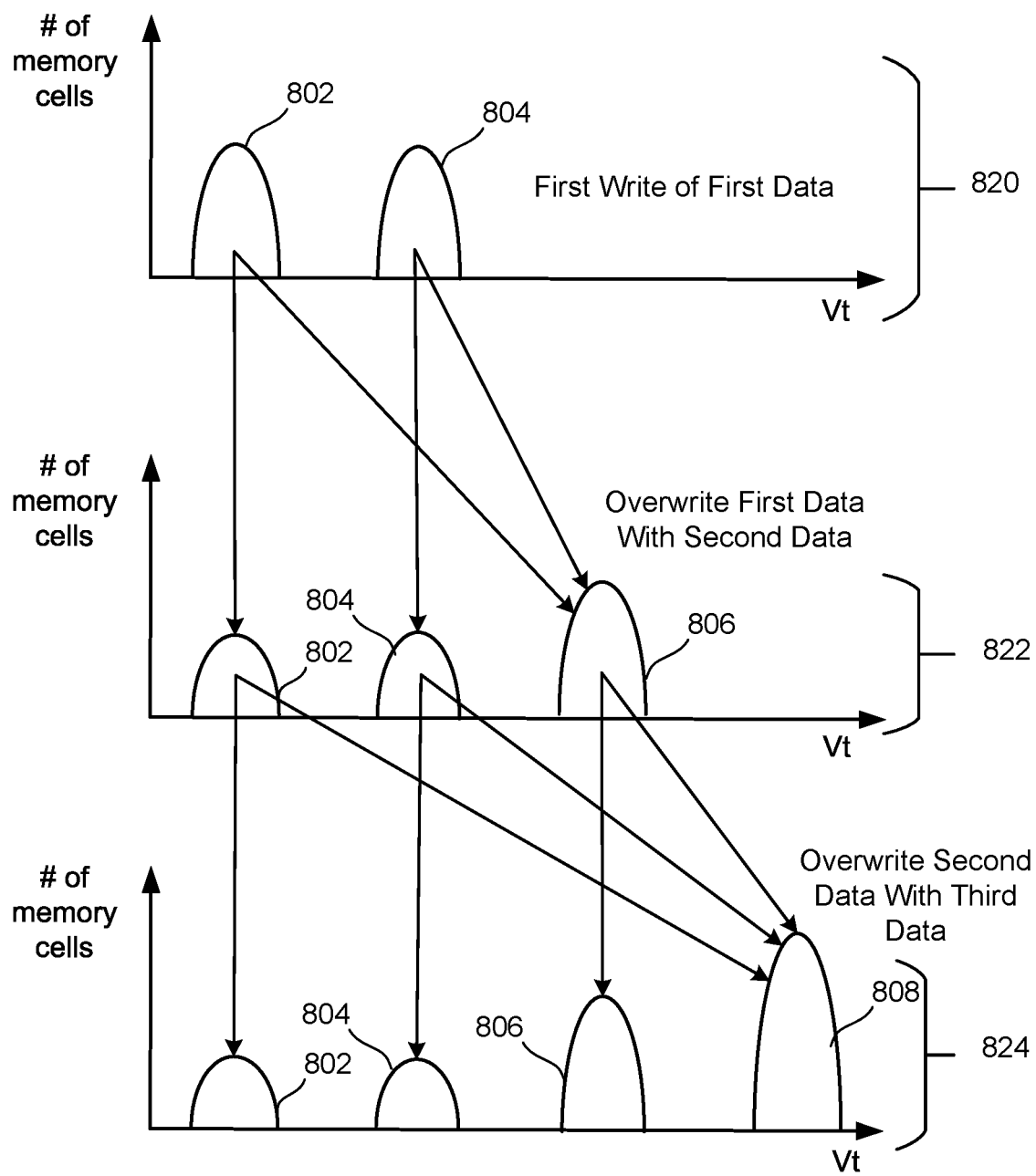
FIGS. 8 and 9 depict graphs of threshold voltage distributions.

FIG. 8 depicts another example of the process of progressively writing data such that existing data is overwritten by new data without the need to perform a traditional erase operation that changes the threshold voltage of the non-volatile memory cells back to the traditional or original erased state. In the embodiment of FIG. 8, SLC data is overwritten by new SLC data without performing a traditional erase operation. FIG. 8 shows three graphs 820, 822 and 824, each of which plots number of memory cells versus threshold voltage. Initially, all of the data is in an initial erase state, corresponding to threshold voltage distribution 802 (which can also be referred to as state 802). A First Write process, which writes First Data, causes the memory cells to be distributed between state 802 and state 804, both of which are threshold voltage distributions. For example, those memory cells storing data "1" will remain in state 802 and those memory cells storing data "0" will be moved by the writing (e.g., programming) process to state 804. That is, the write process causes some of the plurality of non-volatile memory cells to move from the initial erase state 802 to the programmed state 804 of the current set of states (802 and 804).

After performing the First Write process, Second Data is received for a Second Write. The Second Write (from graph 820 to graph 822) comprises overwriting the First Data with the Second Data, without the memory cells that left the initial erased state being first returned to the initial erased state 802. The Second Write is performed using threshold voltage distributions 802, 804 and 806. In the embodiment of FIG. 8, the write process only changes the threshold voltage for memory cells that are to be written with a data "0." Those memory cells that are to be written with data "1" do not have their threshold voltage changed. That is, the existing data is overwritten in the non-volatile memory cells with the new data by moving a subset of the non-volatile memory cells to a programmed state 806 of the new set of states while leaving a subset of the non-volatile memory cells in the initial erase state 802. For example, those memory cells that were in state 802 due to the First Write and are being overwritten with data "1" remain in state 802 and those memory cells that were in state 804 due to the First Write and are being overwritten with data "1" remain in state 804. Those memory cells that were in state 802 due to the First Write and are being overwritten with data "0" are moved to state 806. Those memory cells that were in state 804 due to the First Write and are being overwritten with data "0" are moved to state 806. At the end of the Second Write, those memory cells storing data "1" will be in states 802 or 804 and those memory cells storing data "0" will be in state 806. Note that after the Second Write Process, there are three valid states: 802, 804 and 806. Thus, the technology disclosed herein is not fixed to a number of states that is a power of 2. This provides more flexibility and efficient use of threshold voltagespace.

After performing the Second Write process, Third Data is received for a Third Write. It is intended that the Third Data overwrites the Second Data. A Third Write process (from graph 822 to graph 824) comprises overwriting the Second Data with the Third Data without the memory cells in states 804 and 806 being returned to the initial erased state 802. Like the Second Write, the Third Write only changes threshold voltages of memory cells being overwritten with data "0." For example, those memory cells that were in state 802 due to the Second Write and are being overwritten with data "1" remain in state 802, those memory cells that were in state 804 due to the Second Write and are being overwritten with data "1" remain in state 804, and those memory cells that were in state 806 due to the Second Write and are being overwritten with data "1" remain in state 806. Those memory cells that were in state 804 due to the Second Write and are being overwritten with data "0" are moved to state 808. Those memory cells that were in state 806 due to the Second Write and are being overwritten with data "0" are moved to state 808. At the end of the Third Write, those memory cells storing data "1" will be in states 802, 804 or 806, and those memory cells storing data "0" will be in state 808.

Although FIG. 8 shows SLC data overwriting SLC data, the concept of only changing memory cells storing a "0" can be applied to MLC data too. In such an embodiment, the initial erase state stores "11" and if the new data being used to overwrite existing data is "11" then the memory cell does not have its threshold voltage changed.

Figure 9:
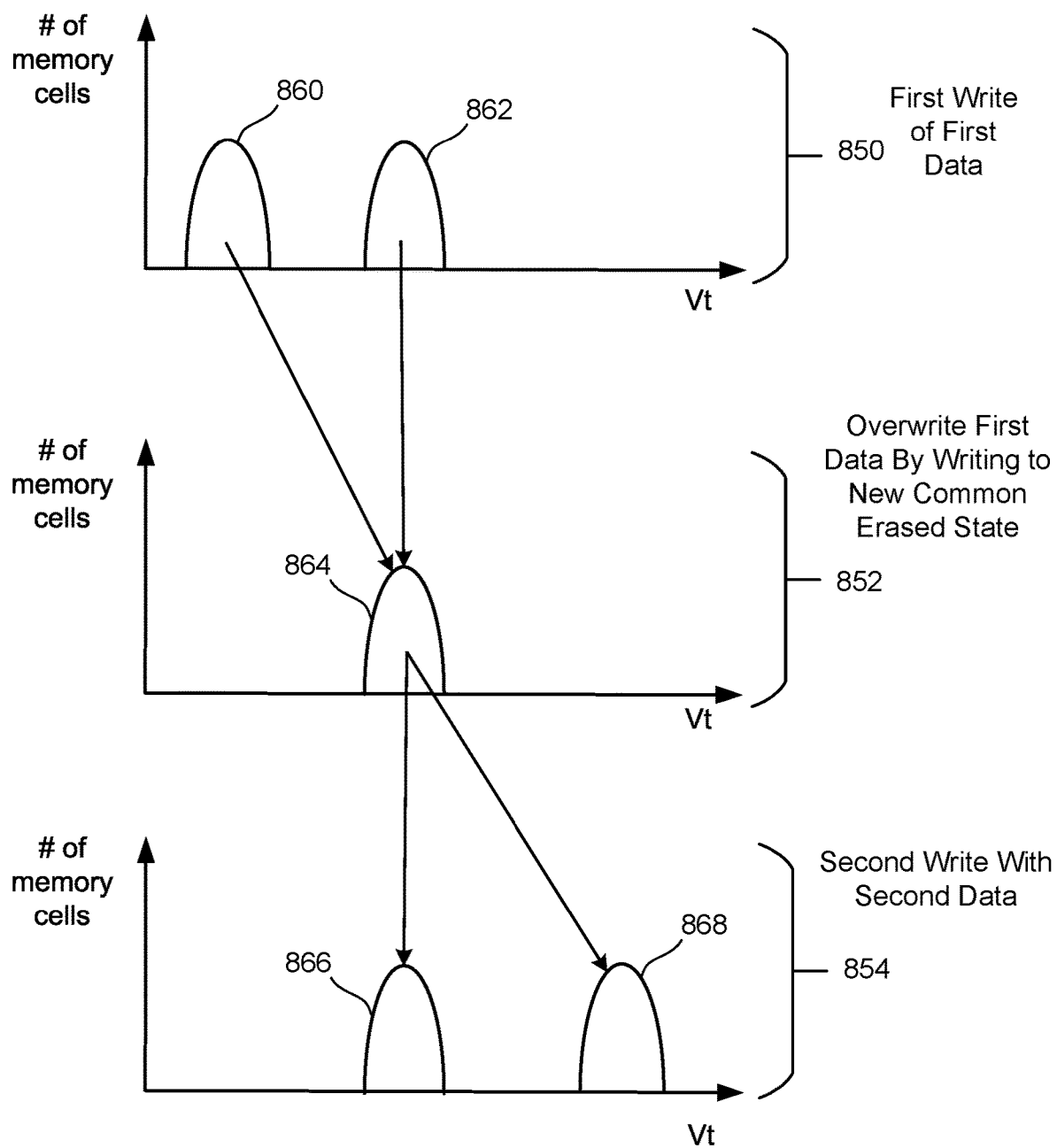

FIG. 9 depicts another example of the process of progressively writing data such that existing data is overwritten by new data without the need to perform a traditional erase operation that changes the threshold voltage of the non-volatile memory cells back to the traditional or original erased state. In the embodiment of FIG. 9, SLC data is overwritten by new SLC data without performing perform a traditional erase operation. FIG. 9 shows three graphs 850, 852 and 854, each of which plots number of memory cells versus threshold voltage. Initially, all of the data is in an initial erase state, corresponding to threshold voltage distribution 860 (which can also be referred to as state 860). A First Write process, which writes First Data, causes the memory cells to be distributed between state 860 and state 862, both of which are threshold voltage distributions. For example, those memory cells storing data "1" will remain in state 860 and those memory cells storing data "0" will be moved by the writing (e.g., programming) process to state 862. That is, the write process causes some of the plurality of non-volatile memory cells to move from the initial erase state 860 to the programmed state 862 of the current set of states (860 and 862).

After performing the First Write process, Second Data is received for a Second Write. It is intended that the Second Data overwrites the First Data. In the embodiment of FIG. 9, subsequent write are performed by first programming/writing all of the memory cells to a same interim state to make it appear that the memory cells are erased. This interim state is referred to as the common new erased state, which is different than the initial erased state 860. After all of the memory cells are in the common new erased state, then all or a subset of memory cells are programmed/written to a new set of one or more states. For example, FIG. 9 shows that when performing the Second Write, all memory cells are programmed to the common new erased state 864. In one embodiment, common new erased state 864 is the same as highest state 862 of the first set of states. In another embodiment, common new erased state 864 partially overlaps with state 862 such that a portion of common new erased state 864 has higher threshold voltages than state 862. In another embodiment, all of common new erased state 864 is higher in voltage magnitude than state 862.

After all of the memory cells are in the common new erased state 864, they are programmed such that the memory cells are distributed between state 866 and state 868. That is, those memory cells that are being overwritten with data "1" are moved to state 866 and those memory cells that are being overwritten with data "0" are moved to state 868. In one embodiment, state 866 is the same as common new erased state 864. In another embodiment, state 866 partially overlaps with common new erased state 864 such that a portion of state 866 has higher threshold voltages than common new erased state 864. In another embodiment, all of state 866 is higher in voltage magnitude than common new erased state 864.

FIG. 9 only shows a First Write and a Second Write. The technique of using a common new erased state can also be used for a Third Write, Fourth Write, etc. For example, when performing a Third Write, the common new erased state can be the same threshold voltage distribution as state 868 (or can be higher in voltage magnitude).

Although FIG. 9 shows SLC data overwriting SLC data, the concept of using a common new erased state can also be used for MLC data. For example, from common new erased state 864, memory cells can be programmed to 3 or more states with higher threshold voltages than common new erased state 864.

Figure 10:
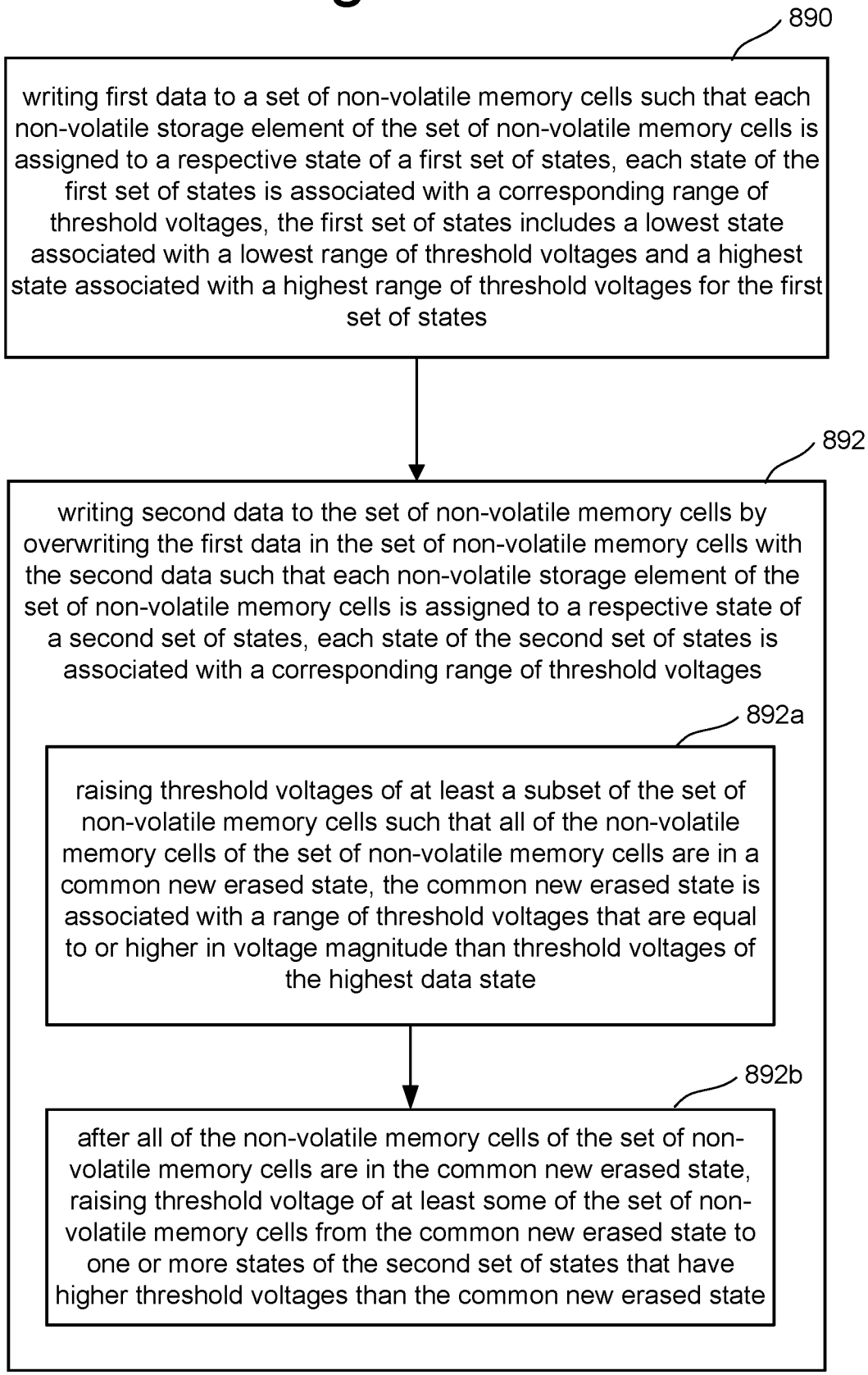
FIG. 10 is a flow chart describing one embodiment of a process for progressively writing data such that existing data is overwritten by new data without the need to perform a traditional erase operation that changes the threshold voltage of the non-volatile memory cells back to the traditional or original erased state.

FIG. 10 is a flow chart describing one embodiment of a process for progressively writing data such that existing data is overwritten by new data without the need to perform a traditional erase operation that changes the threshold voltage of the non-volatile memory cells back to the traditional or original erased state. The process of FIG. 10 describes the embodiment of programming/writing the memory cells to a common new erased state and then from the common new erased state all or a subset of memory cells are programmed/written to a new set of one or more states. Thus, the process of FIG. 10 can be used to implement the system depicted in FIG. 9. The process of FIG. 10 can be implemented by any of the control circuits described above. For example, the process of FIG. 10 can be performed by or at the control of memory controller 102 and/or state machine 362 (or a processor on-board the memory die). The process of FIG. 10 can be used for SLC data or MLC data.

Step 890 of FIG. 10 comprises writing first data to a set of non-volatile memory cells such that each non-volatile memory cell of the set of non-volatile memory cells is assigned to a respective state of a first set of states (e.g., states 860 and 862 of FIG. 9). Each state of the first set of states is associated with a corresponding range of threshold voltages. The first set of states includes a lowest state (e.g., state 860) associated with a lowest range of threshold voltages and a highest state (e.g., state 862) associated with a highest range of threshold voltages for the first set of states. Step 892 comprises overwriting the first data in the set of non-volatile memory cells with second data such that each non-volatile memory cell of the set of non-volatile memory cells is assigned to a respective state of a second set of states (e.g., state 866 and state 868). Each state of the second set of states is associated with a corresponding range of threshold voltages.

In one embodiment step 892, the overwriting the first data in the set of non-volatile memory cells with second data comprises raising threshold voltages of at least a subset of the set of non-volatile memory cells (e.g., graph 850 to graph 852) such that all of the non-volatile memory cells of the set of non-volatile memory cells are in the common new erased state (step 892a). The common new erased state (e.g., state 864 of FIG. 9) is associated with a range of threshold voltages that are equal to or higher in voltage magnitude than threshold voltages of the highest data state. After all of the non-volatile memory cells of the set of non-volatile memory cells are in the common new erased state, threshold voltage of at least some of the set of non-volatile memory cells are raised (e.g., graph 852 to graph 854) from the common new erased state to one or more states of the second set of states that have higher threshold voltages than the common new erased state (step 892b).

FIG. 11 is a flow chart describing one embodiment of a process for progressively writing data such that existing data is overwritten by new data without the need to perform a traditional erase operation that changes the threshold voltage of the non-volatile memory cells back to the traditional or original erased state. The process of FIG. 11 describes the embodiment of programming/writing the memory cells to a common new erased state and then from the common new erased state all or a subset of memory cells are programmed/written to a new set of one or more states. Thus, the process of FIG. 11 can be used to implement the system depicted in FIG. 9. Additionally, the process of FIG. 11 is an example implementation of the process of FIG. 10. The process of FIG. 11 can be implemented by any of the control circuits described above. For example, the process of FIG. 11 can be performed by or at the control of memory controller 102 and/or state machine 362 (or a processor on-board the memory die). The process of FIG. 10 can be used for SLC data or MLC data.

In step 902 of FIG. 11, the system detects the current set of states of the multiple sets of states that the non-volatile memory cells are using to store current data. For example, looking back at FIG. 5, graph 720 includes a first set of states, graph 722 includes a second set of states and graph 724 includes a third set of states. Thus, the multiple sets of states, in regard to FIG. 5, includes the first set of states, the second set of states and the third set of states. As discussed above with respect to FIG. 5, at any given time the memory cells can be in the first set of states, the second set of states or the third set of states. Step 902 of FIG. 11 includes, for example, determining whether the memory cells are in the first set of states, the second set of states or the third set of states. In step 904, the system determines whether the memory cells are already in the highest supported set of states. For example, with respect to FIG. 5, the third set of states associated with graph 724 (e.g. states 706 and 708) represent the highest supported set of states. If the memory cells are already in the highest supported set of states, then the process of FIG. 11 aborts the programming operation (step 906). That is, in one embodiment, if the memory cells are already in the highest supported set of states, then the memory cells need to be erased to the initial erase state before an additional programming process is performed. If, in step 904, it is determined that the memory cells are not already in the highest supported set of states, then in step 908 the system will begin programming the new data to overwrite the existing data. Note that steps 904 and 908 represent an example of determining that an additional set of states is available for storing new data in the set of non-volatile memory cells In step 908, the system senses the data from the memory cells that will be used to store the new data. The sensing of step 908 is to determine what the current data is in those memory cells. In step 910, the data that was sensed is inverted. That is, any data that was a "1" becomes a "0", and any data that was "0" becomes a "1." In step 912, the verify target (e.g., a verify reference voltage Vv) used for programming (see the process of FIG. 4) is set to a voltage magnitude for the current highest state (or higher). In one embodiment, the verify target is set to the lowest voltage magnitude for the current highest state. For example, looking back at FIG. 9, if the data is currently in states 860 and 862, then step 912 includes setting the verify target to be the lowest voltage of state 862. In step 914, the system performs an SLC programming process for the inverted sensed data using the verify target set in step 912. This causes memory cells that are in state 860 to be moved to state 864 and memory cells that are in state 862 to remain in state 862/864 (noting that in this embodiment state 864 is the same as state 862).

In step 916, it is determined whether the SLC programming process completed successfully. If not, the process proceeds to step 906 to abort the current programming operation and perform an erase followed by a subsequent programming. If, however, the SLC programming process of step 914 completed successfully, then all of the memory cells are in the common new erase state. In step 918, the system will update the one or more verify targets and perform a programming of the new data. The programming of the new data can be SLC data or for MLC data. In one embodiment the SLC programming process of FIG. 914 is performed using the process of FIG. 4 which could include applying multiple programming pulses (e.g. multiple iterations of steps 604-626). In another embodiment the process of step 914 can include only applying one programming pulse (e.g. one iteration of steps 604-626). In the embodiment when only one programming pulse is used, the magnitude of the programming pulse has to be set so that all the memory cells can have their threshold voltage raised to be in the common new erase state. Additionally, program verify (e.g. performed during step 610 in FIG. 4) is disabled and not performed.

In one embodiment, when the process of FIG. 11 is performed at the system level (e.g. at the control of memory controller 102), it is possible that step 902 of FIG. 11 causes the data currently being stored in the memory cells (e.g. the existing data) to be read out to the memory controller. If so, then the memory controller need not request that the memory die sends the data in step 908. In an embodiment where the process of FIG. 11 is performed at the memory die level (e.g. performed by or at the control of state machine 362 or another processor on-board the memory die), then it is possible that step 902 includes sensing the data and storing the sensed data in latches on the memory die. If that data is stored on the latches, then it need not be sensed a second time in step 908.

Figure 12:
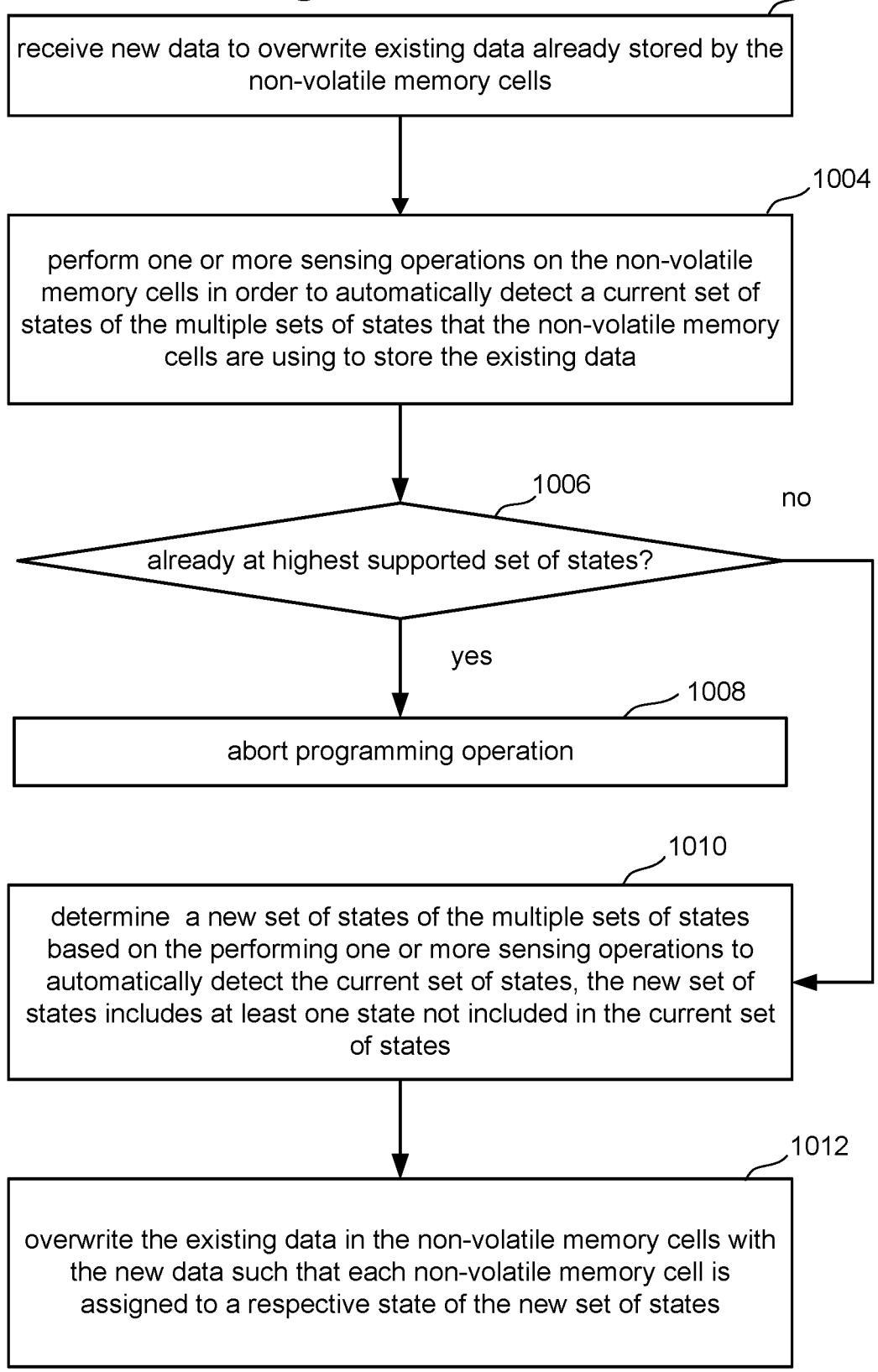
FIG. 12 is a flow chart describing one embodiment of a process for progressively writing data such that existing data is overwritten by new data without the need to perform a traditional erase operation that changes the threshold voltage of the non-volatile memory cells back to the traditional or original erased state.

FIG. 12 is a flowchart describing one embodiment of a process for progressively writing data such that existing data is overwritten by new data without the need to perform a traditional erase operation that changes the threshold voltage of the non-volatile memory cells back to the traditional or original erased state. The process of FIG. 12 is an example implementation of any of the processes of FIGS. 5-11. The process of FIG. 12 can be implemented by any one of the control circuits described above. For example, the process of FIG. 12 can be performed by or at the control of memory controller 102 and/or state machine 362 (or a processor on-board the memory die). The process of FIG. 12 can be used for SLC data or MLC data.

In step 1002 of FIG. 12, new data is received. This new data is to be used to overwrite the existing data stored by the set of non-volatile memory cells. In step 1004, one or more sensing operations are performed on the non-volatile memory cells in order to automatically detect a current set of states of the multiple set of states that the non-volatile memory cells are using to store the existing data. Step 1004 is an example implementation of step 902 of FIG. 11. In step 1006, it is determined whether the memory cells are already at the highest supported set of states. If so, then the current programming operation is aborted in step 1008 so that the memory cells can be erased prior to subsequent programming. If the memory cells are not at the highest supported set of states, then in step 1010 a new set of states of the multiple set of states are determined based on the performing of the one or more sensing operations to automatically detect the current set of states in step 1004. The new set of states includes at least one state not included in the current set of states. For example, looking back at FIG. 5, if the current set of states include states 704/706, then the new set of states includes states 706/708 (step 708 is not included the current set of states). In step 1012, the existing data is overwritten in the non-volatile memory cells with the new data such that each non-volatile memory cell is assigned to a respective state of the new set of states. For example, step 1004 can determine that the memory cells are in states 704/706 of FIG. 5, step 1010 can determine that the new set of states includes steps 706/708, and step 1012 could include programming the memory cells by performing a third write which overwrites the second data with third data (transitioning from graph 722 to graph 724) such that the memory cells are distributed between states 706 and 708. Thus, the process of FIG. 12 determines which set of states of the multiple sets of states that the data is currently being stored so that it can identify which new set of states can be used for the new data that is to be overwritten on top of the old data using the shifted threshold voltage distributions, as discussed above.

Figure 13:
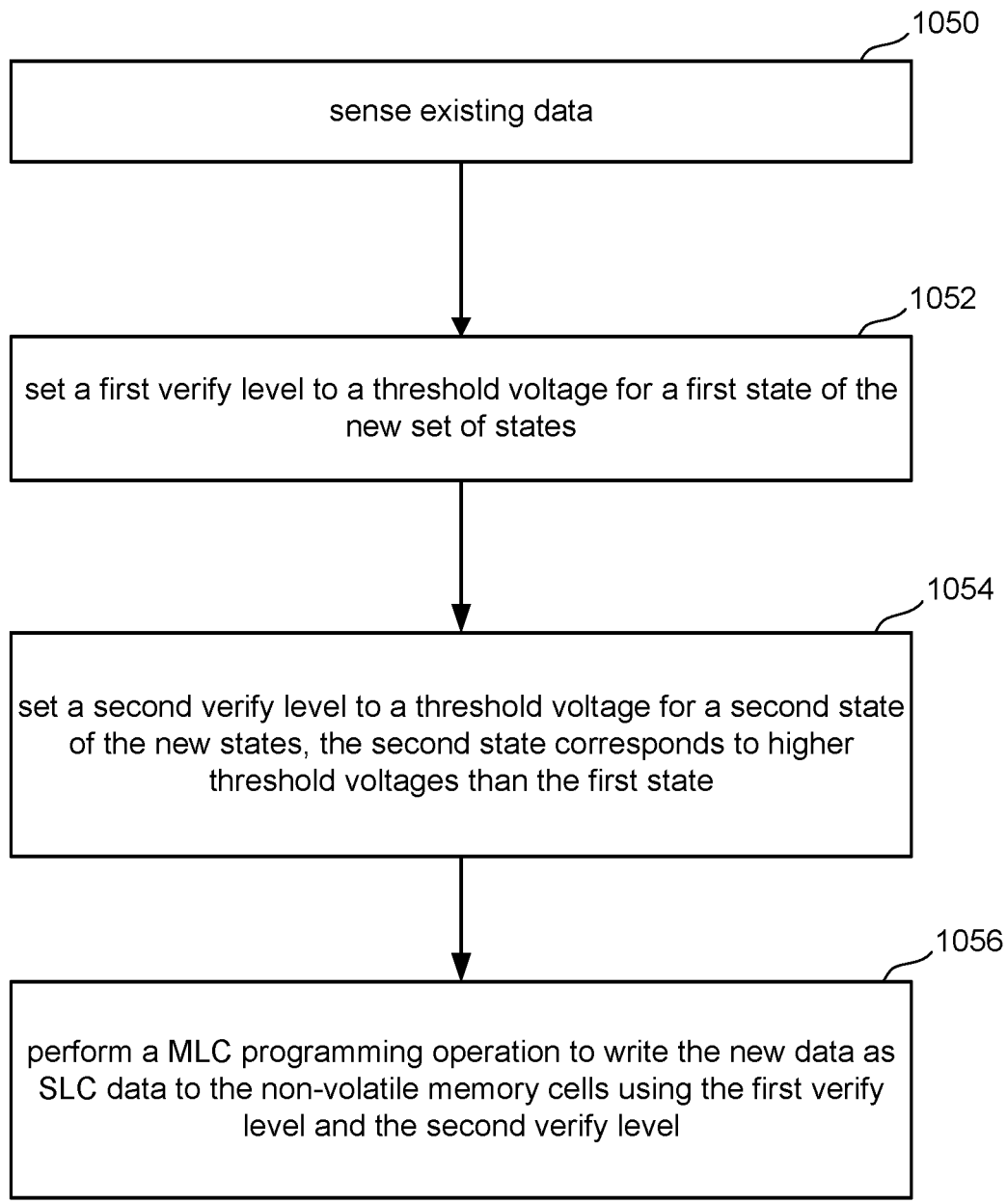
FIG. 13 is a flow chart describing one embodiment of a process for progressively writing data such that existing data is overwritten by new data without the need to perform a traditional erase operation that changes the threshold voltage of the non-volatile memory cells back to the traditional or original erased state.

FIG. 13 is a flowchart describing one embodiment of a process for progressively writing data such that existing data is overwritten by new data without the need to perform a traditional erase operation that changes the threshold voltage of the non-volatile memory cells back to the traditional or original erased state. The process of FIG. 13 is an example implementation of the process depicted in FIG. 5. The process of FIG. 13 can also be used as an example implementation of step 1012 of FIG. 12. The process of FIG. 13 can be implemented by any one of the control circuits described above. For example, the process of FIG. 13 can be performed by or at the control of memory controller 102 and/or state machine 362 (or a processor on-board the memory die). In one example embodiment, the process of FIG. 13 is performed for overwriting SLC data on top of SLC data. In other embodiments, the process of FIG. 13 can be adapted for MLC data.

In step 1050 of FIG. 13, the existing data is sensed. For example, a read operation is performed and that data can be stored in the latches on the memory die. If the process is performed at the system level, the data is sent back to the memory controller. In step 1052, a first verify level (e.g., a verify reference voltage of FIGS. 3A-C) for the subsequent programming is set at a threshold voltage for a first state of the new set of states. In one example, the first verify level is set at the lowest threshold voltage for the lowest state of the new set of states. For example, looking back at FIG. 5, if the data is currently stored in states 704/706, then in one example of step 1052 the first verify level is set to be the lowest threshold voltage of data state 706. In step 1054, the system sets a second verify level to a threshold voltage for a second state of the new states. The second state corresponds to higher threshold voltages than the first state. For example, looking at FIG. 5, and considering the above example, the second verify level can be set in step 1054 to the lowest threshold voltage of state 708. In step 1056 of FIG. 13, the system performs an MLC programming operation to write the new data as SLC data to the non-volatile memory cells using the first verify level and the second verify level. For example, memory cells stored in states 704 and 706 are programmed to be in states 706 and 708. In one embodiment, the memory cells are programmed from states 704 and 706 to two states both of which are higher in voltage magnitude than state 706. Note that step 1056 includes performing an MLC programming operation because memory cells are programmed to two data states or more than two data states. In one example, memory cells can be storing data in states 702 and 704 and step 1056 programs the memory cells to steps 706 and 708. In another embodiment implementing the scheme of FIG. 8, step 1056 can include programming the memory cells from data states 802/804 to states 802/804/806; or from states 802/804 to states 804/806/808; or other variations.

Figure 14:
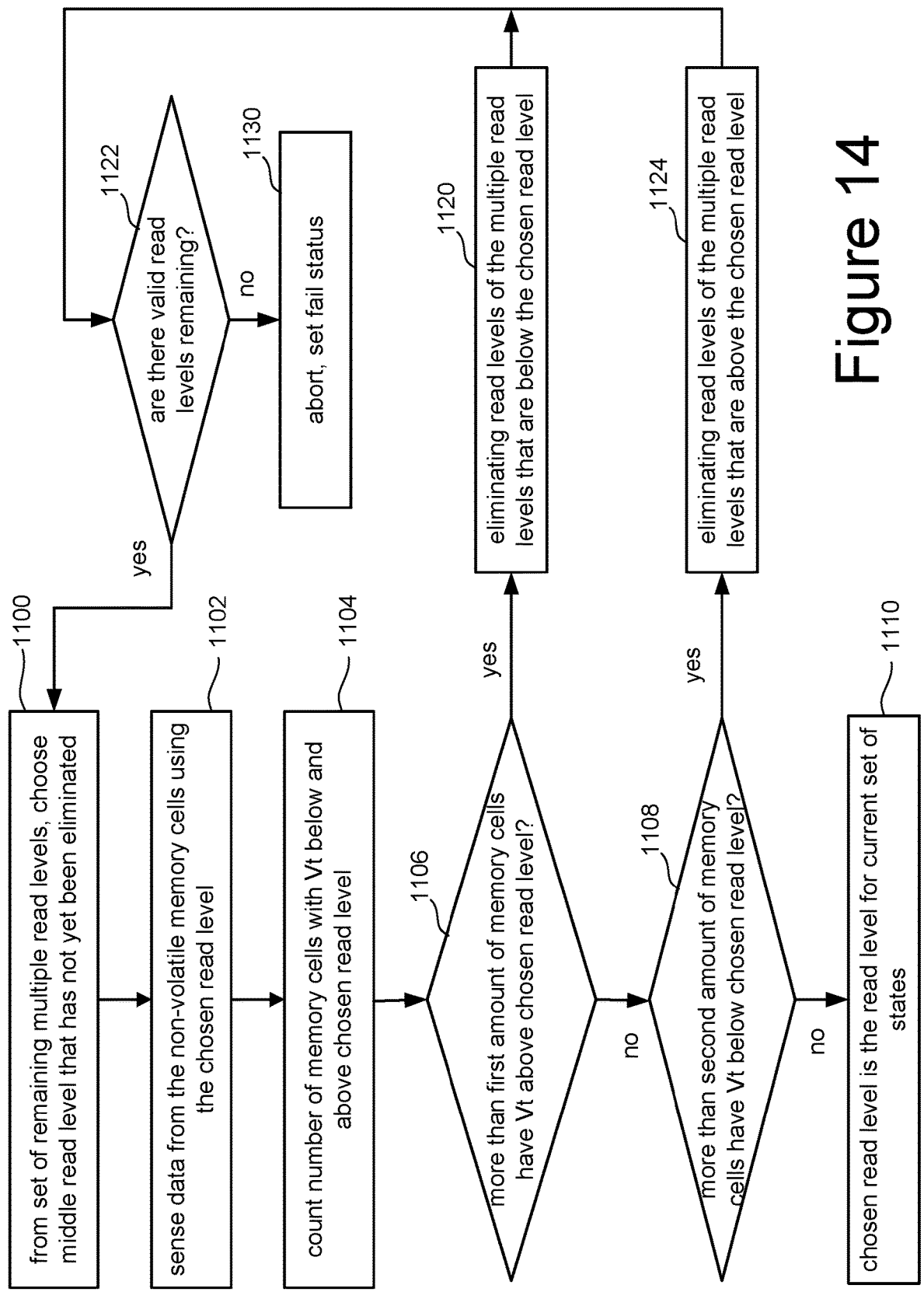
FIG. 14 is a flow chart describing one embodiment of a process for automatically detecting a current set of states of multiple sets of states that the non-volatile memory cells are using to store the existing data.

FIG. 14 is a flowchart describing one embodiment of a process for automatically detecting a current set of states of the multiple set of states that the non-volatile memory cells are using to store the existing data. Thus, the process of FIG. 14 is an example implementation of step 1004 of FIG. 12. The process of FIG. 14 can be implemented by any one of the control circuits described above. For example, the process of FIG. 14 can be performed by or at the control of memory controller 102 and/or state machine 362 (or a processor on-board the memory die). The process of FIG. 14 can be used for SLC data, or adapted to be used for MLC data.

In step 1100 of FIG. 14, from the set of remaining multiple read levels, the system chooses the middle read level that has not yet been eliminated. In one embodiment a read level exists between each pair of adjacent states. The system can perform reads at those read levels to determine what state each memory cell is storing data in. FIGS. 3A, 3B and 3C show examples of read levels (e.g. read reference voltages Vr, Vra). In step 1102, data/information is sensed from the non-volatile memory cells using the chosen read level. In step 1104, the number of memory cells with threshold voltages below the chosen read level are counted. Additionally, the number of memory cells with threshold voltages above the chosen read level are counted. If more than a first amount (e.g., ~50%) of memory cells has threshold voltage (Vt) above the chosen read level (step 1106) then the system eliminates read levels of the multiple read levels that are below the chosen read level in step 1120. If there is not more than a first amount of memory cells with a threshold voltage above the read level, then in step 1108 it is tested whether there are more than a second amount (e.gg., ~50%) of memory cells having a threshold voltage below the chosen read level (step 1108). If so, then the system eliminates read levels of the multiple read levels that are above the chosen read level in step 1124. After steps 1120 and 1124, the process proceeds to step 1122 to determine whether are more valid levels remaining. If so, the process continues to step 1100 and performs another iteration of the process of FIG. 14. If there are no more valid read levels remaining then there is an error and the process will be aborted, returning a status of fail in step 1130.

If, in step 1108, it is determined that there is not more than the second amount of memory cells having a threshold voltage below the chosen read level then the chosen read level is the read level for the current set of states in step 1110. Once the system knows the read level in step 1110 it can identify the state below that read level and the state above that read level, with and those two identified states being the current set of states that have been automatically detected using the process of FIG. 14.

The process of FIG. 14 is an example of performing a binary search of the multiple read levels that includes sensing operations at one or more read levels of the multiple read levels to identify a current read level for which at least a predetermined amount of non-volatile memory cells have threshold voltages above the identified current level and a predetermined amount of non-volatile memory cells have threshold voltages below the identified current level. In some embodiments, it is likely that systems would keep the searches limited by restricting the delta in writes between the various physical locations. For example, no location would be more than four writes behind the max write, so that the range to search in for the level would be smaller. This is like balancing a binary tree for performance/consistency reasons in programming.

Figure 15:
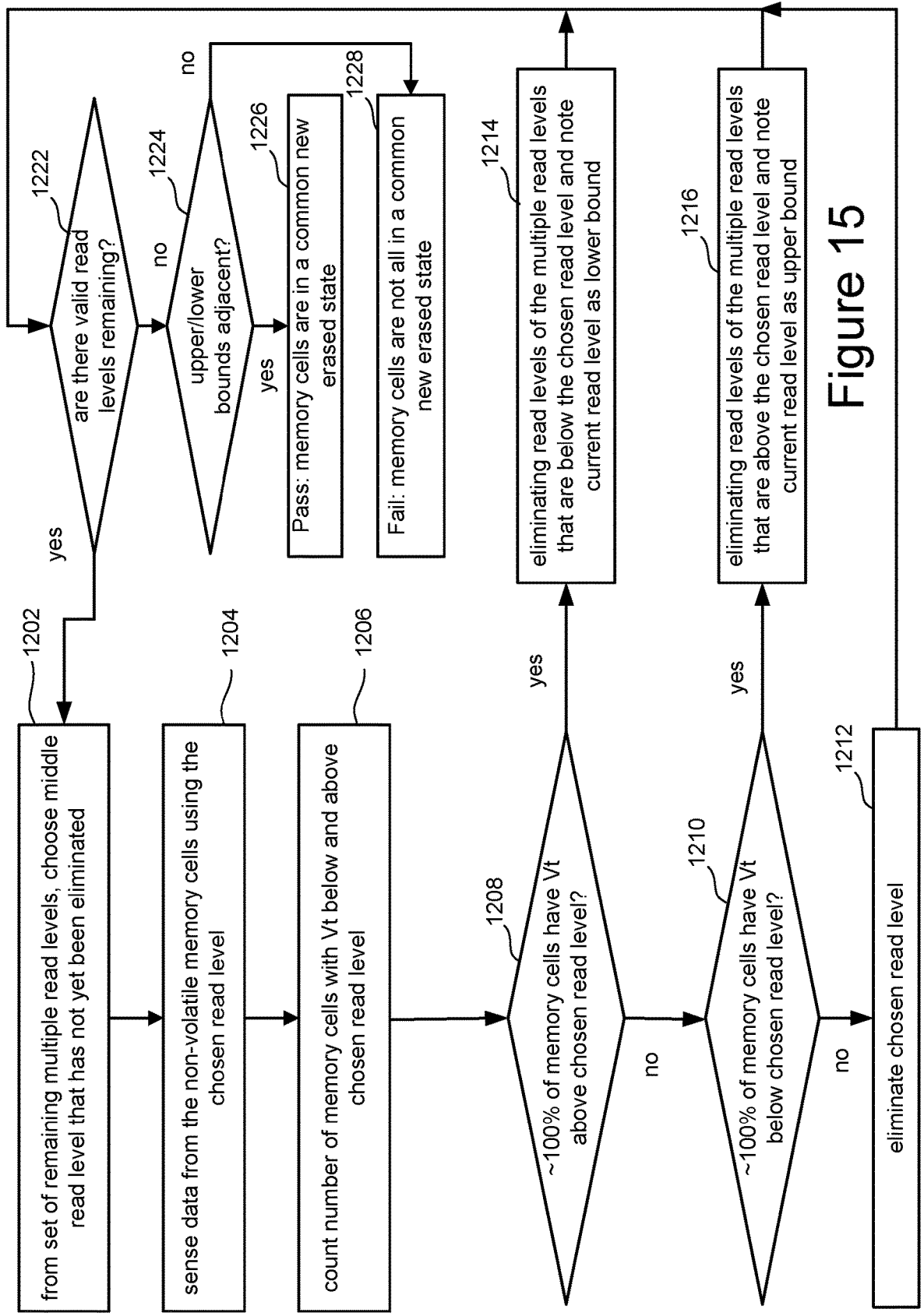
FIG. 15 is a flow chart describing one embodiment of a process for automatically detecting whether non-volatile memory cells are in an common new (intermediate) erased state.

FIG. 15 is a flowchart describing one embodiment of a process for detecting whether a set of non-volatile memory cells are in the common new erase state. The process of FIG. 15 can be implemented by any one of the control circuits described above. For example, the process of FIG. 15 can be performed by or at the control of memory controller 102 and/or state machine 362 (or a processor on-board the memory die). The process of FIG. 15 can be used for SLC data or MLC data.

In step 1202 of FIG. 15, from the set of remaining multiple read levels, the system chooses the middle read level that has not yet been eliminated. Step 1202 of FIG. 15 is similar to step 1100 of FIG. 14. In step 1204, the system senses data from the memory cells using the chosen read level. Step 1204 of FIG. 15 is similar to step 1102 of FIG. 14. In step 1206, the system counts the number of memory cells with threshold voltages below the chosen read level and the number of memory cells with threshold voltages above the chosen read level. Step 1206 is similar to step 1104 of FIG. 14. In step 1208 of FIG. 15, the system determines whether approximately 100% of the memory cells have a threshold voltage above the chosen read level. In other embodiments, percentages less than 100 can be used. If the number of memory cells having threshold voltage above the chosen level is 100% or close to 100%, then the system will eliminate read levels of the multiple read levels that are below the chosen read level and note the current read level as a lower bound. Otherwise, in step 1210, the system will determine whether 100% (or close to 100%) of memory cells have a threshold voltage below the chosen read level. If so, then at step 1216 the system will eliminate the read levels of the multiple read levels that are above the chosen read level and notice the current read level as an upper bound.

If, in step 1210, it is determined that 100% of the memory cells (or close to 100%) do not have their threshold voltage below the chosen read level, then the chosen read level is eliminated from contention in step 1212 and the process continues to step 1222. After steps 1214 and 1216, the process also continues at step 1222, at which time the system determines whether there are any more valid read levels remaining. As noted above, a read level is a synonym for read reference voltage, as discussed above. If there are more valid read levels remaining (step 1222) then the process continues at step 1202 to perform another iteration of the process of FIG. 15. If there are no valid read levels remaining (step 1222) then at step 1224 the system determines whether the upper bound and lower bound (see steps 1214/1216) are adjacent. If so, the process of FIG. 15 was successful (Pass), and the memory cells are in the common new erase state. If the upper bounds and lower bounds are not adjacent then in step 1228, the system determines that the process of FIG. 15 has failed and the memory cells are not all in the common new erase state.

In one embodiment, depending on usage of the memory, it may be advantageous to note that further programming might not have good results. This can be performed at the system level by the memory controller or at the die level by the state machine. One reasons to determine that that further programming might not have good results is if too many memory cells have overshot their intended threshold voltage distribution. Overshoot could be the result of fast to program memory cells and is not a big issue in single pass programs but is an issue in multi pass programming processes as the data might have programmed high enough to corrupt future data programs on top of it. To check for overshoot, a sensing process at the level above the highest state would provide the number of bits above that state. A threshold of bits allowed would likely need to be determined empirically but would need to be well below the corruption capability of an error correction engine.

When programming on top of MLC, in one embodiment, an SLC read level search could be used to find the 50% point. Once that point is known, the MLC uppermost state can be the data state that is one (or more) read/verify voltage level(s) above that point. This uppermost MLC state would become the new erase state from the new distribution that would be programmed on top of it.

In some embodiments, reading and writing is performed on a page. In other embodiments, reading and writing can be performed on a partial page. A partial page is a subset of a page. In one example, a page includes 16 kilobytes of data and partial pages include 4 kilobytes bits of data. To execute a read operation in partial pages, the range of sampling would change to address only that part of the page needed to be read. The read searching algorithms discussed above form the basis of the program operations but to appropriately inhibit other memory cells from programming math would be needed to be applied to the corresponding sense amplifier circuits (otherwise the algorithms would be similar).

If the system keeps track of the page levels for the memory, then searching for the current set of states is not required. The memory die could receive a command with a parameter/feature set to tell it where the data is currently located and where the system would like it to be read at or programmed to. In the case of program, a parameter would be supplied. This would make it so that no searching was required. Additionally this would give the added benefit of being able to program any data to any level of read data at a level without knowing the underlying architecture.

In one example, data is potentially going to be stored on a solid state drive for a long time and so programming it to a higher threshold voltage (which would take more time) might be worth it. For this, leaving more space between the programming state and the erase state would be ideal. Consider an example that can store data in eight states, as depicted in FIG. 3C. The memory controller may tell the state machine which of the data states should be used for erase and which of the data states should be used for program data. For example the memory controller can indicate to the state machine to use state B for data "1" and state F for data "0". In that case, memory controller 102 may indicate to state machine 3621 to use the verify level VrF for programming and to perform read using VrD. Other examples of states to be used for data 1 and data 0 can also be used.

It may be possible that after programming the memory cells to a common new erase state, writing new data may not be advisable. The system could enable features to determine this at the cost of performance. One example being that the data was erased, as requested but it took more pulses than it should have or if too many bits did not program successfully. This would likely be a program verify failure. In another example, the system could run on a quick check of the verify/read levels above and below the placement of the common new erase state's threshold voltage distribution. Unless 100% (or close to 100%) of the memory cells are within those two levels, then it would be good to note this is a problem in the status transmitted from the memory die back to the memory controller. This would include verify above the distribution and verify below the distribution with an OR'ing of the results to get a status. For debug purposes doing both verify results in different bits and registers would be ideal.

In some embodiments, memory cells should be in data states that are relatively close in threshold voltage to neighbor memory cells. For example, looking at FIG. 3D, it would be best that a memory cell is not in state S1 while its neighbors are all in states S14 and S15.

Tables 1, 2 and 3 (see above) provide examples of encoding schemes for mapping data to states. Other encoding schemes can also be used. In some embodiments, the encoding scheme can be changed when overwriting existing data with new data using the various processes discussed above.

A non-volatile storage system has been disclosed that provides for progressive writing of data. That is, existing data is overwritten by new data without the need to perform a traditional erase operation that changes the threshold voltage of the non-volatile memory cells back to the initial erase state. In one example, new data is written on top of old data using shifted threshold voltage distributions.

One embodiment includes a set of non-volatile memory cells and a control circuit connected to the non-volatile memory cells. The control circuit is configured to cause the set of non-volatile memory cells to be in an initial erase state; write first data to the set of non-volatile memory cells as SLC data such that at least a subset of non-volatile memory cells leave the initial erase state and each respective non-volatile memory cell of the set of non-volatile memory cells is assigned to a respective state of a first set of states based on a first respective data value to be stored in the respective non-volatile memory cell; and write second data to the set of non-volatile memory cells as multi-level cell ("MLC") data by overwriting the first data in the set of non-volatile memory cells without reverting any of the subset of non-volatile memory cells back to the initial erase state such that each respective non-volatile memory cell of the set of non-volatile memory cells is assigned to a respective state of a second set of states based on a second respective data value to be stored in the respective non-volatile memory cell, the second set of states includes more states than the first set of states, the overwriting the first data comprises removing and replacing the first data with the second data.

In one example implementation, each state of the first set of states is associated with a corresponding range of threshold voltages, the first set of states includes a lowest state associated with a lowest range of threshold voltages and a highest state associated with a highest range of threshold voltages for the first set of states; and each state of the second set of states is associated with a corresponding range of threshold voltages such that all of the threshold voltages for the second set of states are higher in voltage magnitude than threshold voltages for the lowest state and at least a subset of the threshold voltages for the second set of states are higher in voltage magnitude than all of the threshold voltages for the first set of states.

In one example implementation, the control circuit is configured to overwrite the first data in the set of non-volatile memory cells by raising threshold voltages for at least a subset of the set of non-volatile memory cells without lowering threshold voltage for any of the set of non-volatile memory cells.

In one example implementation, the control circuit is configured to write the first data to the set of non-volatile memory cells as SLC data by causing the set of non-volatile memory cells to store one bit of data in any one of two states of the first set of states; and the control circuit is configured to overwrite the first data by causing the set of non-volatile memory cells to store two or more bits of data in any one of four or more states of the second set of states.

In one example implementation, each state of the first set of states is associated with a corresponding range of threshold voltages, the first set of states includes a highest state associated with a highest range of threshold voltages for the first set of states; each state of the second set of states is associated with a corresponding range of threshold voltages; the first set of states includes at least one state not included in second set of states; and the control circuit is configured to overwrite the first data by: raising threshold voltages of at least a subset of the set of non-volatile memory cells such that all of the non-volatile memory cells of the set of non-volatile memory cells are in a common new erased state, the common new erased state is associated with a range of threshold voltages that are equal to or higher in voltage magnitude than threshold voltages of the highest data state, and after all of the non-volatile memory cells of the set of non-volatile memory cells are in the common new erased state, raising threshold voltage of at least some of the set of non-volatile memory cells from the common new erased state to one or more states of the second set of states that have higher threshold voltages than the common new erased state.

In one example implementation, the control circuit is configured to detect whether the set of non-volatile memory cells are in the common new erased state.

In one example implementation, the control circuit is configured to overwrite the first data by: sensing the first data from the set of non-volatile memory cells; inverting the sensed data; setting a verify target to be at a voltage magnitude for a highest state of the first set of states; performing a SLC programming process for the inverted sensed data and the verify target; and performing a MLC programming process for the second data.

In one example implementation, the set of non-volatile memory cells are configured to store data in multiple sets of states including the first set of states and the second set of states. Additionally, the control circuit is configured to: perform one or more sensing operations on the set of non-volatile memory cells in order to automatically detect a current set of states of the multiple sets of states that the non-volatile memory cells are using to store current data, determine a new set of states of the multiple sets of states based on the performing one or more sensing operations to automatically detect the current set of states, the new set of states includes at least one state not included in the current set of states, subsequent overwriting is to be performed using the new set of states.

In one example implementation, the set of non-volatile memory cells are configured to store data in multiple sets of states including the first set of states and the second set of states. Additionally, the control circuit is configured to: determine if the set of non-volatile memory cells are currently storing data in a highest supported state, and cause an erase operation to be performed for the set of non-volatile memory cells if the set of non-volatile memory cells are currently storing data in a highest supported state.

In one example implementation, the set of non-volatile memory cells are configured to store data in multiple sets of states including the first set of states and the second set of states, the multiple sets of states includes multiple read levels. The control circuit is configured to perform a binary search of the multiple read levels that includes sensing operations at one or more read levels of the multiple read levels to identify a current read level for which at least a predetermined amount of non-volatile memory cells have threshold voltages above the identified current level and a predetermined amount of non-volatile memory cells have threshold voltages below the identified current level.

One embodiment includes a method comprising writing first data to a set of non-volatile memory cells such that each non-volatile memory cell of the set of non-volatile memory cells is assigned to a respective state of a first set of states, each state of the first set of states is associated with a corresponding range of threshold voltages, the first set of states includes a lowest state associated with a lowest range of threshold voltages and a highest state associated with a highest range of threshold voltages for the first set of states; and writing second data to the set of non-volatile memory cells by overwriting the first data in the set of non-volatile memory cells with the second data such that each non-volatile memory cell of the set of non-volatile memory cells is assigned to a respective state of a second set of states, each state of the second set of states is associated with a corresponding range of threshold voltages. The overwriting the first data in the set of non-volatile memory cells with second data comprises raising threshold voltages of at least a subset of the set of non-volatile memory cells such that all of the non-volatile memory cells of the set of non-volatile memory cells are in a common new erased state, the common new erased state is associated with a range of threshold voltages that are equal to or higher in voltage magnitude than threshold voltages of the highest data state and after all of the non-volatile memory cells of the set of non-volatile memory cells are in the common new erased state, raising threshold voltage of at least some of the set of non-volatile memory cells from the common new erased state to one or more states of the second set of states that have higher threshold voltages than the common new erased state.

In one example implementation, the writing first data causes a first subset of the non-volatile memory cells to be in the lowest state and a second subset of the non-volatile memory cells to be in the highest state.

In one example implementation, the method further comprises causing the set of non-volatile memory cells to be in an initial erase state prior to the writing the first data; and the overwriting the first data in the set of non-volatile memory cells with second data is performed without reverting any of the set of non-volatile memory cells in the highest state back to the initial erase state.

In one example implementation, the method further comprises automatically detecting whether all of the non-volatile memory cells of the set of non-volatile memory cells are in the common new erased state.

In one example implementation, the overwriting the first data further comprises: determining that the set of non-volatile memory cells are storing data in the first set of states; determining that an additional set of states is available for storing data in the set of non-volatile memory cells, the additional set of states is the second set of states; sensing the first data from the set of non-volatile memory cells; inverting the sensed first data; setting a verify target to be at a voltage magnitude for the highest state; performing a SLC programming process for the inverted sensed data using the verify target; updating the verify target to be a voltage for a state of the second set of states; and performing a SLC programming process for the second data using the updated verify target.

One embodiment includes an apparatus comprising a plurality of non-volatile memory cells configured to store data in multiple sets of states; and a control circuit connected to the non-volatile memory cells. The control circuit is configured to: receive new data to overwrite existing data already stored by the non-volatile memory cells; perform one or more sensing operations on the non-volatile memory cells in order to automatically detect a current set of states of the multiple sets of states that the non-volatile memory cells are using to store the existing data; determine a new set of states of the multiple sets of states based on the performing one or more sensing operations to automatically detect the current set of states, the new set of states includes at least one state not included in the current set of states; and overwrite the existing data in the non-volatile memory cells with the new data such that each non-volatile memory cell is assigned to a respective state of the new set of states.

In one example implementation, each state of the first set of states is associated with a corresponding range of threshold voltages, the first set of states includes a lowest state associated with a lowest range of threshold voltages and a highest state associated with a highest range of threshold voltages for the first set of states; each state of the second set of states is associated with a corresponding range of threshold voltages; the control circuit is further configured to raise threshold voltages of at least a subset of the set of non-volatile memory cells such that all of the non-volatile memory cells of the set of non-volatile memory cells are in a common new erased state, the common new erased state is associated with a range of threshold voltages that are equal to or higher in voltage magnitude than threshold voltages of the highest data state; the control circuit is further configured to overwrite the existing data with the new data by, after all of the non-volatile memory cells of the set of non-volatile memory cells are in the common new erased state, raising threshold voltage of at least some of the set of non-volatile memory cells from the common new erased state to one or more states of the new set of states that have higher threshold voltages than the common new erased state.

In one example implementation, the control circuit is configured to: cause the plurality of non-volatile memory cells to be in an initial erase state; write the existing data to the plurality of non-volatile memory cells by causing some of the plurality of non-volatile memory cells to move from the initial erase state to a programmed state of the current set of states; and overwrite the existing data in the non-volatile memory cells with the new data by moving a subset of the non-volatile memory cells to a programmed state of the new set of states while leaving a subset of the non-volatile memory cells in the initial erase state.

In one example implementation, the existing data and the new data are SLC data. Additionally, the control circuit is further configured to overwrite the existing data with the new data by: setting a first verify level to a threshold voltage for a first state of the new set of states; setting a second verify level to a threshold voltage for a second state of the new states, the second state corresponds to higher threshold voltages than the first state; and performing a MLC programming operation to write the new data as SLC data to the non-volatile memory cells using the first verify level and the second verify level.

In one example implementation, the multiple sets of states are associated with multiple read levels. Additionally, the control circuit is configured to perform the one or more sensing operations on the non-volatile memory cells in order to automatically detect the current set of states by: (a) choosing one read level of the multiple read levels that has not been eliminated; (b) sensing data from the non-volatile memory cells using the chosen read level; (c) eliminating read levels of the multiple read levels that are below the chosen read level if a first predetermined amount of non-volatile memory cells have a threshold voltage greater than the chosen read level; (d) eliminating read levels of the multiple read levels that are above the chosen read level if a second predetermined amount of non-volatile memory cells have a threshold voltage less than the chosen read level; (e) determining that the current set of states is a set of states of the multiple sets of which has a highest state corresponding to the chosen read level if the amount of non-volatile memory cells that have threshold voltages greater than the chosen read level is less than the first predetermined amount and the amount of non-volatile memory cells that have threshold voltages less than the chosen read level is less than the second predetermined amount; (f) repeating (a)-(e) if the amount of non-volatile memory cells that have threshold voltages greater than the chosen read level is greater than the first predetermined amount or the amount of non-volatile memory cells that have threshold voltages less than the chosen read level is greater than the second predetermined amount.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a set of non-volatile memory cells; and
a control circuit connected to the non-volatile memory cells, the control circuit is configured to:
cause the set of non-volatile memory cells to be in an initial erase state;
write first data to the set of non-volatile memory cells as single level cell ("SLC") data such that at least a subset of non-volatile memory cells leave the initial erase state and each respective non-volatile memory cell of the set of non-volatile memory cells is assigned to a respective state of a first set of states based on a first respective data value to be stored in the respective non-volatile memory cell; and
write second data to the set of non-volatile memory cells as multi-level cell ("MLC") data by overwriting the first data in the set of non-volatile memory cells without reverting any of the subset of non-volatile memory cells back to the initial erase state such that each respective non-volatile memory cell of the set of non-volatile memory cells is assigned to a respective state of a second set of states based on a second respective data value to be stored in the respective non-volatile memory cell, the second set of states includes more states than the first set of states, the overwriting the first data comprises removing and replacing the first data with the second data.

2. The non-volatile storage apparatus of claim 1, wherein:
each state of the first set of states is associated with a corresponding range of threshold voltages, the first set of states includes a lowest state associated with a lowest range of threshold voltages and a highest state associated with a highest range of threshold voltages for the first set of states; and
each state of the second set of states is associated with a corresponding range of threshold voltages such that all of the threshold voltages for the second set of states are higher in voltage magnitude than threshold voltages for the lowest state and at least a subset of the threshold voltages for the second set of states are higher in voltage magnitude than all of the threshold voltages for the first set of states.

3. The non-volatile storage apparatus of claim 1, wherein:
the control circuit is configured to overwrite the first data in the set of non-volatile memory cells by raising threshold voltages for at least a subset of the set of non-volatile memory cells without lowering threshold voltage for any of the set of non-volatile memory cells.

4. The non-volatile storage apparatus of claim 1, wherein:
the control circuit is configured to write the first data to the set of non-volatile memory cells as SLC data by causing the set of non-volatile memory cells to store one bit of data in any one of two states of the first set of states; and
the control circuit is configured to overwrite the first data by causing the set of non-volatile memory cells to store two or more bits of data in any one of four or more states of the second set of states.

5. The non-volatile storage apparatus of claim 1, wherein:
each state of the first set of states is associated with a corresponding range of threshold voltages, the first set of states includes a highest state associated with a highest range of threshold voltages for the first set of states;
each state of the second set of states is associated with a corresponding range of threshold voltages;
the first set of states includes at least one state not included in second set of states; and
the control circuit is configured to overwrite the first data by:
raising threshold voltages of at least a subset of the set of non-volatile memory cells such that all of the non-volatile memory cells of the set of non-volatile memory cells are in a common new erased state, the common new erased state is associated with a range of threshold voltages that are equal to or higher in voltage magnitude than threshold voltages of the highest data state, and
after all of the non-volatile memory cells of the set of non-volatile memory cells are in the common new erased state, raising threshold voltage of at least some of the set of non-volatile memory cells from the common new erased state to one or more states of the second set of states that have higher threshold voltages than the common new erased state.

6. The non-volatile storage apparatus of claim 5, wherein:
the control circuit is configured to detect whether the set of non-volatile memory cells are in the common new erased state.

7. The non-volatile storage apparatus of claim 1, wherein the control circuit is configured to overwrite the first data by:
sensing the first data from the set of non-volatile memory cells;
inverting the sensed data;
setting a verify target to be at a voltage magnitude for a highest state of the first set of states;
performing a SLC programming process for the inverted sensed data and the verify target; and
performing a MLC programming process for the second data.

8. The non-volatile storage apparatus of claim 1, wherein:
the set of non-volatile memory cells are configured to store data in multiple sets of states including the first set of states and the second set of states; and
the control circuit is configured to:
perform one or more sensing operations on the set of non-volatile memory cells in order to automatically detect a current set of states of the multiple sets of states that the non-volatile memory cells are using to store current data, and
determine a new set of states of the multiple sets of states based on the performing one or more sensing operations to automatically detect the current set of states, the new set of states includes at least one state not included in the current set of states, subsequent overwriting is to be performed using the new set of states.

9. The non-volatile storage apparatus of claim 1, wherein:
the set of non-volatile memory cells are configured to store data in multiple sets of states including the first set of states and the second set of states; and
the control circuit is configured to:
determine if the set of non-volatile memory cells are currently storing data in a highest supported state, and
cause an erase operation to be performed for the set of non-volatile memory cells if the set of non-volatile memory cells are currently storing data in a highest supported state.

10. The non-volatile storage apparatus of claim 1, wherein:
the set of non-volatile memory cells are configured to store data in multiple sets of states including the first set of states and the second set of states, the multiple sets of states includes multiple read levels; and the control circuit is configured to perform a binary search of the multiple read levels that includes sensing operations at one or more read levels of the multiple read levels to identify a current read level for which at least a predetermined amount of non-volatile memory cells have threshold voltages above the identified current level and a predetermined amount of non-volatile memory cells have threshold voltages below the identified current level.

11. A method comprising:

writing first data to a set of non-volatile memory cells such that each non-volatile memory cell of the set of non-volatile memory cells is assigned to a respective state of a first set of states, each state of the first set of states is associated with a corresponding range of threshold voltages, the first set of states includes a lowest state associated with a lowest range of threshold voltages and a highest state associated with a highest range of threshold voltages for the first set of states; and writing second data to the set of non-volatile memory cells by overwriting the first data in the set of non-volatile memory cells with the second data such that each non-volatile memory cell of the set of non-volatile memory cells is assigned to a respective state of a second set of states, each state of the second set of states is associated with a corresponding range of threshold voltages, the overwriting the first data in the set of non-volatile memory cells with second data comprises:

raising threshold voltages of at least a subset of the set of non-volatile memory cells such that all of the non-volatile memory cells of the set of non-volatile memory cells are in a common new erased state, the common new erased state is associated with a range of threshold voltages that are equal to or higher in voltage magnitude than threshold voltages of the highest data state, and after all of the non-volatile memory cells of the set of non-volatile memory cells are in the common new erased state, raising threshold voltage of at least some of the set of non-volatile memory cells from the common new erased state to one or more states of the second set of states that have higher threshold voltages than the common new erased state.

12. The method of claim 11, wherein:

the writing first data causes a first subset of the non-volatile memory cells to be in the lowest state and a second subset of the non-volatile memory cells to be in the highest state.

13. The method of claim 11, further comprising:

causing the set of non-volatile memory cells to be in an initial erase state prior to the writing the first data; and the overwriting the first data in the set of non-volatile memory cells with second data is performed without reverting any of the set of non-volatile memory cells in the highest state back to the initial erase state.

14. The method of claim 11, further comprising:

automatically detecting whether all of the non-volatile memory cells of the set of non-volatile memory cells are in the common new erased state.

15. The method of claim 11, wherein the overwriting the first data further comprises:

determining that the set of non-volatile memory cells are storing data in the first set of states;

determining that an additional set of states is available for storing data in the set of non-volatile memory cells, the additional set of states is the second set of states;

sensing the first data from the set of non-volatile memory cells;

inverting the sensed first data;

setting a verify target to be at a voltage magnitude for the highest state;

performing a SLC programming process for the inverted sensed data using the verify target;

updating the verify target to be a voltage for a state of the second set of states; and performing a SLC programming process for the second data using the updated verify target.

16. A non-volatile storage apparatus, comprising:

a plurality of non-volatile memory cells configured to store data in multiple sets of states; and a control circuit connected to the non-volatile memory cells, the control circuit is configured to:

receive new data to overwrite existing data already stored by the non-volatile memory cells;

perform one or more sensing operations on the non-volatile memory cells in order to automatically detect a current set of states of the multiple sets of states that the non-volatile memory cells are using to store the existing data;

determine a new set of states of the multiple sets of states based on the performing one or more sensing operations to automatically detect the current set of states, the new set of states includes at least one state not included in the current set of states; and overwrite the existing data in the non-volatile memory cells with the new data such that each non-volatile memory cell is assigned to a respective state of the new set of states.

17. The non-volatile storage apparatus of claim 16, wherein:

each state of the first set of states is associated with a corresponding range of threshold voltages, the first set of states includes a lowest state associated with a lowest range of threshold voltages and a highest state associated with a highest range of threshold voltages for the first set of states;

each state of the second set of states is associated with a corresponding range of threshold voltages;

the control circuit is further configured to raise threshold voltages of at least a subset of the set of non-volatile memory cells such that all of the non-volatile memory cells of the set of non-volatile memory cells are in a common new erased state, the common new erased state is associated with a range of threshold voltages that are equal to or higher in voltage magnitude than threshold voltages of the highest data state; and the control circuit is further configured to overwrite the existing data with the new data by, after all of the non-volatile memory cells of the set of non-volatile memory cells are in the common new erased state, raising threshold voltage of at least some of the set of non-volatile memory cells from the common new erased state to one or more states of the new set of states that have higher threshold voltages than the common new erased state.

18. The non-volatile storage apparatus of claim 16, wherein the control circuit is configured to:
- cause the plurality of non-volatile memory cells to be in an initial erase state;
- write the existing data to the plurality of non-volatile memory cells by causing some of the plurality of non-volatile memory cells to move from the initial erase state to a programmed state of the current set of states; and
- overwrite the existing data in the non-volatile memory cells with the new data by moving a subset of the non-volatile memory cells to a programmed state of the new set of states while leaving a subset of the non-volatile memory cells in the initial erase state.

19. The non-volatile storage apparatus of claim 16, wherein:
- the existing data and the new data are SLC data;
- the control circuit is further configured to overwrite the existing data with the new data by:
  - setting a first verify level to a threshold voltage for a first state of the new set of states;
  - setting a second verify level to a threshold voltage for a second state of the new states, the second state corresponds to higher threshold voltages than the first state; and
  - performing a MLC programming operation to write the new data as SLC data to the non-volatile memory cells using the first verify level and the second verify level.

20. The non-volatile storage apparatus of claim 16, wherein:
- the multiple sets of states are associated with multiple read levels; and
- the control circuit is configured to perform the one or more sensing operations on the non-volatile memory cells in order to automatically detect the current set of states by:
  - (a) choosing one read level of the multiple read levels that has not been eliminated;
  - (b) sensing data from the non-volatile memory cells using the chosen read level;
  - (c) eliminating read levels of the multiple read levels that are below the chosen read level if a first predetermined amount of non-volatile memory cells have a threshold voltage greater than the chosen read level;
  - (d) eliminating read levels of the multiple read levels that are above the chosen read level if a second predetermined amount of non-volatile memory cells have a threshold voltage less than the chosen read level;
  - (e) determining that the current set of states is a set of states of the multiple sets of which has a highest state corresponding to the chosen read level if the amount of non-volatile memory cells that have threshold voltages greater than the chosen read level is less than the first predetermined amount and the amount of non-volatile memory cells that have threshold voltages less than the chosen read level is less than the second predetermined amount;
  - (f) repeating (a)-(e) if the amount of non-volatile memory cells that have threshold voltages greater than the chosen read level is greater than the first predetermined amount or the amount of non-volatile memory cells that have threshold voltages less than the chosen read level is greater than the second predetermined amount.

* * * * *